United States Patent
Chaki et al.

(10) Patent No.: US 11,418,285 B2
(45) Date of Patent: Aug. 16, 2022

(54) METHOD AND APPARATUS FOR CONSTRUCTION OF POLAR CODES

(71) Applicant: NEC Corporation, Tokyo (JP)

(72) Inventors: Prakash Chaki, Tokyo (JP); Norifumi Kamiya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/283,289

(22) PCT Filed: Oct. 10, 2018

(86) PCT No.: PCT/JP2018/037736
§ 371 (c)(1),
(2) Date: Apr. 7, 2021

(87) PCT Pub. No.: WO2020/075240
PCT Pub. Date: Apr. 16, 2020

(65) Prior Publication Data
US 2021/0391945 A1  Dec. 16, 2021

(51) Int. Cl.
*H04L 1/00* (2006.01)
*H03M 13/09* (2006.01)
(Continued)

(52) U.S. Cl.
CPC ........ *H04L 1/0057* (2013.01); *H03M 13/091* (2013.01); *H03M 13/15* (2013.01);
(Continued)

(58) Field of Classification Search
CPC ... H04L 1/0057; H04L 1/0045; H04L 1/0071; H03M 13/091; H03M 13/15; H03M 13/271; H03M 13/45
See application file for complete search history.

(56) References Cited

U.S. PATENT DOCUMENTS

2018/0183464 A1  6/2018  Ge
2019/0044656 A1*  2/2019  Huang ................. H04L 1/0071
(Continued)

FOREIGN PATENT DOCUMENTS

JP  2020-516131 A  5/2020
WO  2018/130892 A1  7/2018
(Continued)

OTHER PUBLICATIONS

International Search Repeat for PCT Application No. PCT/JP2018/037736, dated Jun. 18, 2019.
(Continued)

*Primary Examiner* — Thien Nguyen

(57) ABSTRACT

A communication apparatus for forward error correction and detection using polar codes comprising a polar encoder that encodes an input vector to output a codeword using a generator matrix of polar code wherein the input vector is a cyclic redundancy check (CRC) codeword of an information block; a memory that stores a frozen set including frozen bit indices and a non-frozen set including non-frozen bit indices sorted in order of error probabilities; and a controller that is configured to take as input the CRC codeword where CRC bits appended to the end of information block and interleave the CRC codeword using at least one of a first interleaver and second interleaver before feeding the CRC codeword to polar encoder such that the first interleaver places at least one CRC bit earlier than its original position in the CRC codeword and a second interleaver selects at least one bit from the CRC codeword whose corresponding index in a parity check matrix of the CRC code has the highest column weight and puts it in the non-frozen bit index with highest error probability.

16 Claims, 19 Drawing Sheets

(51) Int. Cl.
*H03M 13/15* (2006.01)
*H03M 13/27* (2006.01)
*H03M 13/45* (2006.01)

(52) U.S. Cl.
CPC ......... *H03M 13/271* (2013.01); *H03M 13/45* (2013.01); *H04L 1/0045* (2013.01); *H04L 1/0071* (2013.01)

(56) References Cited

U.S. PATENT DOCUMENTS

| | | | |
|---|---|---|---|
| 2020/0052719 A1* | 2/2020 | Chaki | H03M 13/098 |
| 2020/0244288 A1* | 7/2020 | Noh | H04L 1/0047 |
| 2021/0152186 A1* | 5/2021 | Jang | H03M 13/2742 |

FOREIGN PATENT DOCUMENTS

| | | |
|---|---|---|
| WO | 2018/179246 A1 | 10/2018 |
| WO | 2019/053618 A1 | 3/2019 |

OTHER PUBLICATIONS

English translation of Written opinion for PCT Application No. PCT/JP2018/037736, dated Jun. 18, 2018.

E. Arikan, "Channel polarization: A method for constructing capacity-achieving codes for symmetric binary-input memoryless channels", IEEE Transactions of Information Theory, vol. 55, pp. 3051-3073, Jul. 2009.

I. Tal et al., "List decoding of polar codes", IEEE Transactions of Information Theory, vol. 61, No. 5, pp. 2213-2226, May 2015.

Kai Niu et al. "CRC-aided decoding of polar codes", IEEE Communications Letters, vol. 16, No. 10, pp. 1668-1671, Oct. 2012.

Jonas Eriksson et al. "Complexity Reduction of Blind Decoding Schemes Using CRC Splitting", Globecom 2012—Signal Processing for Communications Symposium, pp. 3731-3736, Dec. 2012.

NEC Corporation, "Polar code construction with single CRC polynomial and interleaver", 3GPP TSG-RAN WG1 Meeting #90, R1-1712334, Aug. 21-25, 2017, Prague, Czech Republic.

Minzi Xu et al., "Distance Spectrum and Optimized Design of Concatenated Polar Codes", 2017 9th International Conference on Wireless Communications and Signal Processing (WCSP), IEEE. Oct. 11, 2017.

Nokia et al., "Design details of distributed CRC", 3GPP TSG RAN WG1 Meeting #89, R1-1708833, May 15-19, 2017, Hangzhou, P.R. China.

Nokia et al., "Details of CRC distribution of Polar design", 3GPP TSG-RAN WG1 Meeting #88, R1-1703497, Feb. 13-17, 2017, Athens, Greece.

Japanese Office Action for JP Application No. 2021-518214 dated May 10, 2022 with English Translation.

* cited by examiner

FIG.5 FIRST EXEMPLARY EMBODIMENT

FIG.10 SECOND EXEMPLARY EMBODIMENT

FIG.13 EXAMPLE OF COMPUTATION OF PARITY-CHECK MATRIX OF CRC CODE

FIG.18

| TrCH (TRANSPORT CHANNELS) | PHYSICAL CHANNEL |
|---|---|
| UPLINK SHARED CHANNEL (UL-SCH) | PHYSICAL UPLINK SHARED CHANNEL (PUSCH) |
| RANDOM ACCESS CHANNEL (RACH) | PHYSICAL RANDOM ACCESS CHANNEL (PRACH) |
| DOWNLINK SHARED CHANNEL (DL-SCH) | PHYSICAL DOWNLINK SHARED CHANNEL (PDSCH) |
| BROADCAST CHANNEL (BCH) | PHYSICAL BROADCAST CHANNEL (PBCH) |
| PAGING CHANNEL (PCH) | PHYSICAL DOWNLINK SHARED CHANNEL (PDSCH) |

FIG.19

| Control Information | Physical Channel |
|---|---|
| UCI (Uplink Control Information) | Physical Uplink Control Channel (PUCCH), Physical Uplink Shared Channel (PUSCH) |
| DCI (Downlink Control Information) | Physical Downlink Control Channel (PDCCH) |

METHOD AND APPARATUS FOR CONSTRUCTION OF POLAR CODES

This application is a National Stage Entry of PCT/JP2018/037736 filed on Oct. 10, 2018, the contents of all of which are incorporated herein by reference, in their entirety.

TECHNICAL FIELD

The present invention relates to a communication apparatus using polar codes, and particularly to techniques for construction of check-bit (e.g., parity-check (PC) or cyclic-redundancy check (CRC)) concatenated polar codes.

BACKGROUND

Polar codes introduced in NPL 1 are the first family of provably capacity-achieving codes in Binary-Input Discrete Memoryless Symmetric (BI-DMS) class of channels. Polarization is a linear transform that can convert N copies of a BI-DMS channel into one of the two extremes, i.e., bit-channels with very low error probabilities (very high capacities) or bit-channels with very high error probabilities (very low capacities), where N is length of a polar codeword. It may be noted from NPL 1 that for very large codelength N (asymptotic case), the fraction of bit-channels with low error probabilities can approach the capacity of the underlying BI-DMS channel. Encoding of (N, K) polar codes involve:

putting information bits at K indices out of N indices that have relatively low error probabilities (also called Non-Frozen (NF) set) and putting a constant bit pattern (such as all-zero pattern) at the remaining N—K indices that have higher error probabilities; and then multiplying the resulting vector with the generator matrix G which may be n-times Kronecker product of a 2×2 matrix $G_2$ $$G_2 = \begin{pmatrix} 1 & 0 \\ 1 & 1 \end{pmatrix}, \quad \text{(Math. 1)}$$

referred to as the polarizing kernel. The resulting codeword is then transmitted.

The decoder at the receiver side takes the log-likelihood ratios (LLRs) of the received values as input and performs decoding to output the estimated information vector. Successive Cancellation (SC) decoder introduced in NPL 1 is the most fundamental decoder for polar codes. Subsequently, SC List decoder (SCL) and CRC-aided SCL (CA-SCL) decoders have been introduced in NPL 2 and NPL 3 to boost up the decoding performance. In CRC concatenated polar code construction (see NPL 2 and NPL 3), an information string can be first encoded by CRC encoder. The CRC codeword may then be fed as input to the polar encoder. The resulting polar codeword may be transmitted over a communication channel. The receiver may use a SC or SCL decoder to decode the polar codeword and recover the CRC codeword. The CRC codeword thus obtained may be subjected to CRC test for detecting any decoding error introduced by SC/SCL decoder. An SCL decoder may use a CRC check to identify a correct decoding path from a pool of candidate decoding paths surviving in the list till the end of SCL decoding.

In case of CRC-concatenated polar codes, the CRC bits are usually appended to the end of information bits before polar encoding. CRC check is normally performed after the SC/SCL decoding of polar code is finished. Thus, a decoding error can only be detected once the SC/SCL decoding is finished. This may cause increased latency and unnecessary power consumption in the event when SC/SCL decoder makes an error. How to detect a decoding error early during the SC/SCL decoding process is an important technical problem.

In order to detect a decoding error early in the decoding process, NPL 4 has proposed early decoding termination using a CRC splitting technique. NPL5 has proposed polar code construction to support early termination using a single CRC polynomial and interleaver.

The discussion presented above as background information is only aimed at helping the understanding of the present disclosure.

CITATION LIST

Non Patent Literature

[NPL 1]
E. Arikan, "Channel polarization: A method for constructing capacity-achieving codes for symmetric binary-input memoryless channels", IEEE Transactions of Information Theory, vol. 55, pp. 3051-3073, July 2009.

[NPL 2]
I. Tal and A. Vardy, "List decoding of polar codes", IEEE Transactions of Information Theory, vol. 61, no. 5, pp. 2213-2226, May 2015.

[NPL 3]
Kai Niu et al. "CRC-aided decoding of polar codes", IEEE Communications Letter, vol. 16, issue 10, October 2012.

[NPL 4]
Jonas Eriksson et al. "Complexity Reduction of Blind Decoding Schemes Using CRC Splitting", Globecom 2012—Signal Processing for Communications Symposium (December, 2012)

[NPL 5]
3GPP TSG-RAN WG1 Meeting #90, R1-1712334, Aug. 21-25, 2017

SUMMARY

Technical Problem

Like any other digital signature method, CRC may have a finite probability with which an error may go undetected. To be precise, there can be an event when there is an error but CRC fails to detect it. If we call the probability of occurrence of such an event as the 'undetected error probability' of CRC, then an important problem is how to reduce the undetected error probability of CRC-concatenated polar codes.

One objective of the present invention is to provide a technique for reducing the undetected error rate of the CRC-concatenated polar codes.

Another objective of the present invention is to provide a technique for enabling CRC detection early during the SC/SCL decoding process while reducing the undetected error rate of the CRC-concatenated polar codes. By achieving these two objectives, it is possible to construct a CRC-concatenated polar codes that can detect decoding error early while preserving the undetected error rate at the same time.

Solution to Problem

According to an aspect of the present invention, a communication apparatus for forward error correction and detection using polar codes comprising a polar encoder that encodes an input vector to output a codeword using a generator matrix of polar code wherein the input vector is a cyclic redundancy check (CRC) codeword of an information block; a memory that stores a frozen set including frozen bit indices and a non-frozen set including non-frozen bit indices sorted in order of error probabilities; and a controller that is configured to take as input the CRC codeword where CRC bits appended to the end of information block and interleave the CRC codeword using at least one of a first interleaver and second interleaver before feeding the CRC codeword to polar encoder such that the first interleaver places at least one CRC bit earlier than its original position in the CRC codeword and a second interleaver selects at least one bit from the CRC codeword whose corresponding index in a parity check matrix of the CRC code has the highest column weight and puts it in the non-frozen bit index with highest error probability.

According to a further aspect of the present invention, a sender device for forward error correction and detection using polar codes, includes: a cyclic redundancy check (CRC) encoder that appends CRC bits to an information block to output a CRC codeword; an interleaver that interleaves the CRC codeword using at least one of a first interleaver and second interleaver to output an interleaved CRC codeword; a polar encoder that encodes the interleaved CRC codeword using a generator matrix of polar code to output a polar codeword; a memory that stores a frozen set including frozen bit indices and a non-frozen set including non-frozen bit indices sorted in order of error probabilities; and a controller that controls the interleaver to select the first interleaver and the second interleaver, wherein the first interleaver places at least one CRC bit earlier than its original position in the CRC codeword; and the second interleaver selects at least one bit from the CRC codeword whose corresponding index in a parity check matrix of the CRC code has the highest column weight and puts it in the non-frozen bit index with highest decoding error probability.

According to a further aspect of the present invention, an encoding method in a sender device for forward error correction and detection using polar codes, includes: by a cyclic redundancy check (CRC) encoder, appending CRC bits to an information block to output a CRC codeword; by an interleaver, interleavings the CRC codeword using at least one of a first interleaver and second interleaver to output an interleaved CRC codeword; by a polar encoder, encoding the interleaved CRC codeword using a generator matrix of polar code to output a polar codeword; by a memory, storing a frozen set including frozen bit indices and a non-frozen set including non-frozen bit indices sorted in order of error probabilities; and by a controller, controlling the interleaver to select the first interleaver and the second interleaver, wherein the first interleaver places at least one CRC bit earlier than its original position in the CRC codeword; and the second interleaver selects at least one bit from the CRC codeword whose corresponding index in a parity check matrix of the CRC code has the highest column weight and puts it in the non-frozen bit index with highest decoding error probability.

According to a still further aspect of the present invention, a receiver device for receiving a polar codeword from a sender device for forward error correction and detection using polar codes, comprising: a forward error correction (FEC) decoder that decodes the polar codeword by using one of a Successive Cancellation decoding algorithm and a Successive Cancellation List decoding algorithm; a deinterleaver that deinterleaves an output of the FEC decoder; and a controller that controls the FEC decoder and the deinterleaver using at least one of a first interleaver and a second interleaver, wherein at the sender device, a cyclic redundancy check (CRC) encoder appends CRC bits to an information block to output a CRC codeword; an interleaver interleaves the CRC codeword using at least one of the first interleaver and the second interleaver to output an interleaved CRC codeword; a polar encoder encodes the interleaved CRC codeword using a generator matrix of polar code to output the polar codeword; and a memory stores a frozen set including frozen bit indices and a non-frozen set including non-frozen bit indices sorted in order of error probabilities, wherein the first interleaver places at least one CRC bit earlier than its original position in the CRC codeword; and the second interleaver selects at least one bit from the CRC codeword whose corresponding index in a parity check matrix of the CRC code has the highest column weight and puts it in the non-frozen bit index with highest decoding error probability.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims. In addition to the objects mentioned, other obvious and apparent advantages of the invention will be reflected from the detailed specification and drawings.

Advantageous Effects of Invention

According to an exemplary embodiment of the present disclosure, CRC detection will be possible during the SC/SCL decoding process. Thus it will not be required to wait till the SC/SCL decoding is completed to perform CRC check. This will reduce the latency and power consumption among other apparent advantages.

According to an exemplary embodiment of the present disclosure, it will be possible to reduce the undetected error rate of the CRC-concatenated polar codes.

As an apparent advantage of the present disclosure, it will be possible to construct a CRC-concatenated polar codes that can detect decoding error before completion of SC/SCL decoding, while restricting a potential rise in undetected error rate.

BRIEF DESCRIPTION OF DRAWINGS

FIG. 18 is a table illustrating an example of mapping to physical channels for transport channels.

FIG. 19 is a table illustrating an example of mapping to physical channels for control information.

DETAILED DESCRIPTION

Hereinafter, the word "exemplary" is used herein to mean "serving as an example, instance, or illustration". Any embodiment described herein as "exemplary" is not necessarily to be construed as preferred or advantageous over other embodiments.

1. OUTLINE OF EXEMPLARY EMBODIMENTS

The conventional technical problems as discussed above can be solved by one or more variants of the exemplary embodiments of the present invention. In this present disclosure, a method for good interleaving technique of outer CRC codes is introduced before polar encoding in order to construct CRC-concatenated polar codes. Though the following description outlines the method using CRC, however the present invention and its many variants can be suitably adapted for use with parity-check concatenated polar codes as well by anyone skilled in the art.

1.1) System

Figure 1:
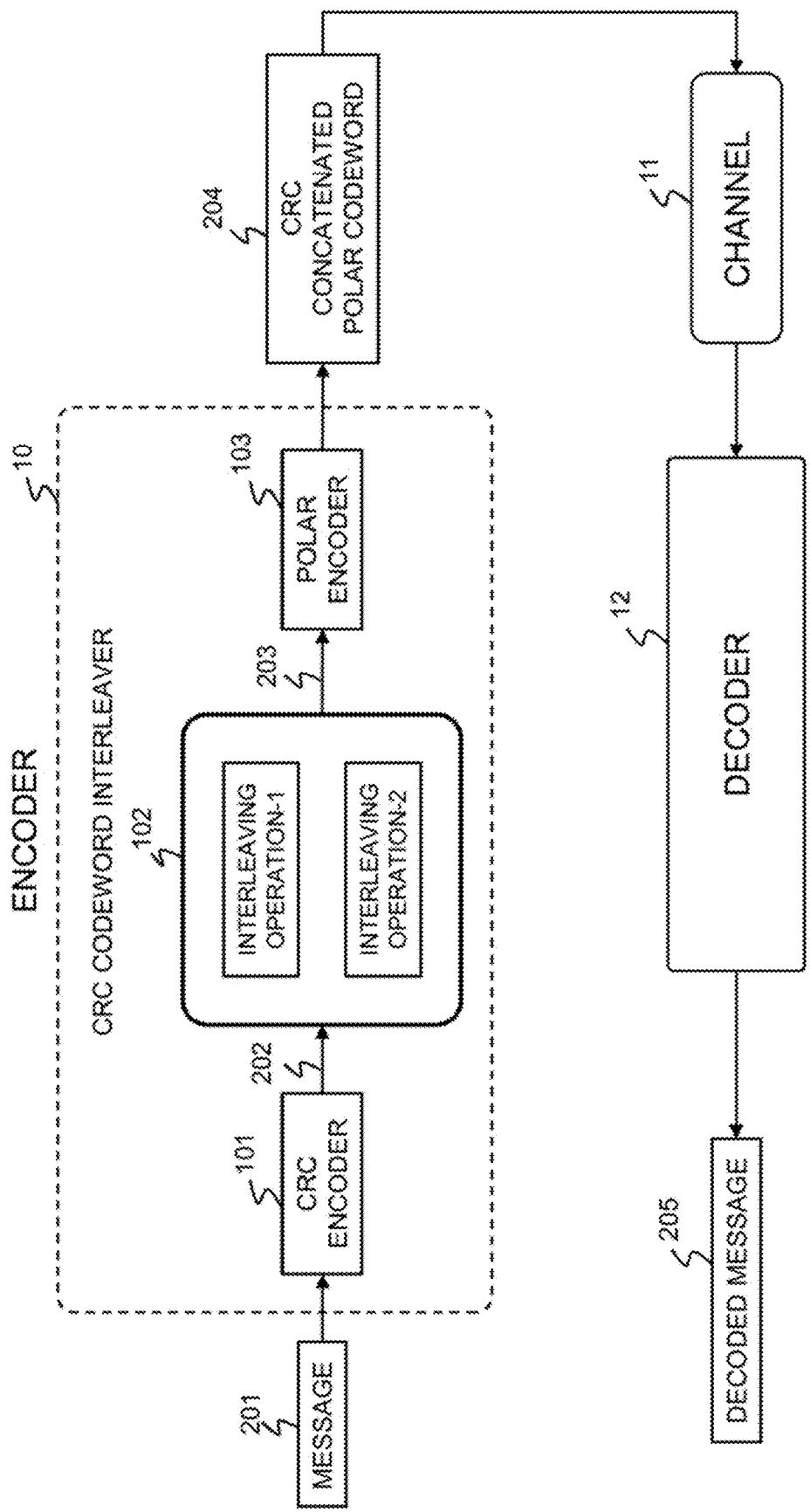
FIG. 1 is a schematic diagram illustrating a system composed of an encoder at a sender side and a decoder at a receiver side, wherein the encoder performs an encoding operation of CRC-concatenated polar codes according to an exemplary embodiment of the present invention.

Referring to FIG. 1, an outline of an exemplary embodiment according to the present invention will be described, assuming a communication system in which an encoder 10 is connected to a decoder 12 through a channel 11. The encoder 10 has functions of a CRC encoder 101, an interleaver 102 and a polar encoder 103. The encoder 10 implements a construction method of CRC-concatenated polar codes that can potentially offer two key advantages:

(1) detecting a decoding error during SC/SCL decoding process based on interleaving operation-1; and (2) reducing the undetected error rate of the CRC-concatenated polar code based on interleaving operation-2.

A message string 201 is first subjected to CRC encoding by the CRC encoder 101, wherein the CRC bits may be appended to the end of the message string 201. The CRC codeword 202 thus produced may be subjected to an interleaving operation by the interleaver 102, which may use at least one of the interleaving operation-1 and the interleaving operation-2. The interleaver 102 may use an interleaving operation obtained from a combination of interleaving operation-1 and interleaving operation-2. After interleaving the CRC codeword 202, the interleaved CRC codeword 203 is fed as input to the polar encoder 103. The output of the polar encoder 103 is a resulting CRC-concatenated polar code 204. In summary, for the encoder 10 constructs CRC-concatenated polar code according to an exemplary embodiment of the present invention.

The decoder 12 may include a SC/SCL decoder which decodes the CRC-concatenated polar codeword to output the outer CRC codeword according to SC/SCL decoding procedure, and further decodes a decoded message 205 from the CRC codeword by CRC checks.

As described in the background art, a CRC check can be done after completion of the SCL decoding to check if a decoding path is correct or not. Since the SC/SCL decoder can decode the CRC-concatenated polar codeword in a bit-by-bit sequential fashion, if the CRC bits are at the end positions of the CRC codeword, they may get decoded at the last. This means the CRC check can only be done once the SC/SCL decoding is finished and it may not be possible to identify a decoding error earlier than that. Thus, in the case of a decoding error, the SC/SCL decoder may still continue its decoding operation till the end of the frame which may lead to unnecessary decoding operations, resulting in increased latency and power consumption. If a CRC check is made possible at one or more intermediate stage of SC/SCL decoder, then it may be possible to detect a decoding error early and thus prevent the aforementioned problem.

<Interleaver-1 for Early Termination>

It is possible to interleave the CRC bits inside the CRC codeword before polar encoding in an efficient manner such that a CRC check can be performed at an intermediate stage of SC/SCL decoding. Thus, if it is found that no decoding path of SCL decoder satisfies the CRC check at the intermediate decoding stage, the SCL decoding operation may be terminated immediately. Let us call this "early termination". Early termination can save unnecessary computations associated with decoding of the subsequent bits, resulting in reduced latency and power consumption. The interleaver 102 has to be carefully designed so that at least some of the CRC bits can be moved to early positions in the SC decoding order to achieve early termination. This means, a CRC bit may be positioned immediately after information bits that are used to compute its value, instead of positioning the CRC bit after all information bits, i.e., at the very end of the frame. From the discussion in this paragraph, the advantages of applying such an interleaving is apparent. Good early termination can be achieved by introducing a first technique, as interleaver-1, of interleaving the CRC codeword prior to polar encoding. It may be understood that earlier the position of a CRC bit in the polar decoding order, the better it may fare in terms of early termination. How to obtain an interleaving pattern for CRC codeword aiming early termination will be described later.

<Interleaver-2 for Good Error Detection>

While interleaving the CRC codeword prior to polar encoding may offer the benefits of early termination, it may also degrade the undetected error probability of the CRC code. Polar codes of finite length (especially, short length polar codes) may not have same error probability at all indices of non-frozen set. Thus if a CRC bit is interleaved and moved to an early position in the polar decoding order, then it may be possible that some indices of relatively high error probability appear after the interleaved CRC bit. Errors introduced at such indices may not be possible to be detected by the interleaved CRC bit. This may impact the error detection capability of a CRC code. However, as discussed earlier, interleaving of CRC may be needed to achieve early termination by CRC even though it may come with a concomitant limitation of impacting the error detection rate of CRC.

Thus, we introduce a second technique, as interleaver-2, of interleaving the CRC codeword prior to polar encoding to achieve good error detection rate. How to obtain an interleaving pattern for CRC codeword aiming good error detection rate will be described later.

<Combination of Interleaver-1 and Interleaver-2>

In addition, we introduce a third technique, as a combination of interleaver-1 and interleaver-2, of interleaving the CRC codeword prior to polar encoding to achieve both or either of the early termination and the good error detection rate. How to obtain such an interleaving pattern for CRC codeword aiming both early termination and good error detection rate will be described later.

1.2) Encoder Operation

A basic operation of the encoder 10 will be described by referring to FIGS. 2-4.

Figure 2:
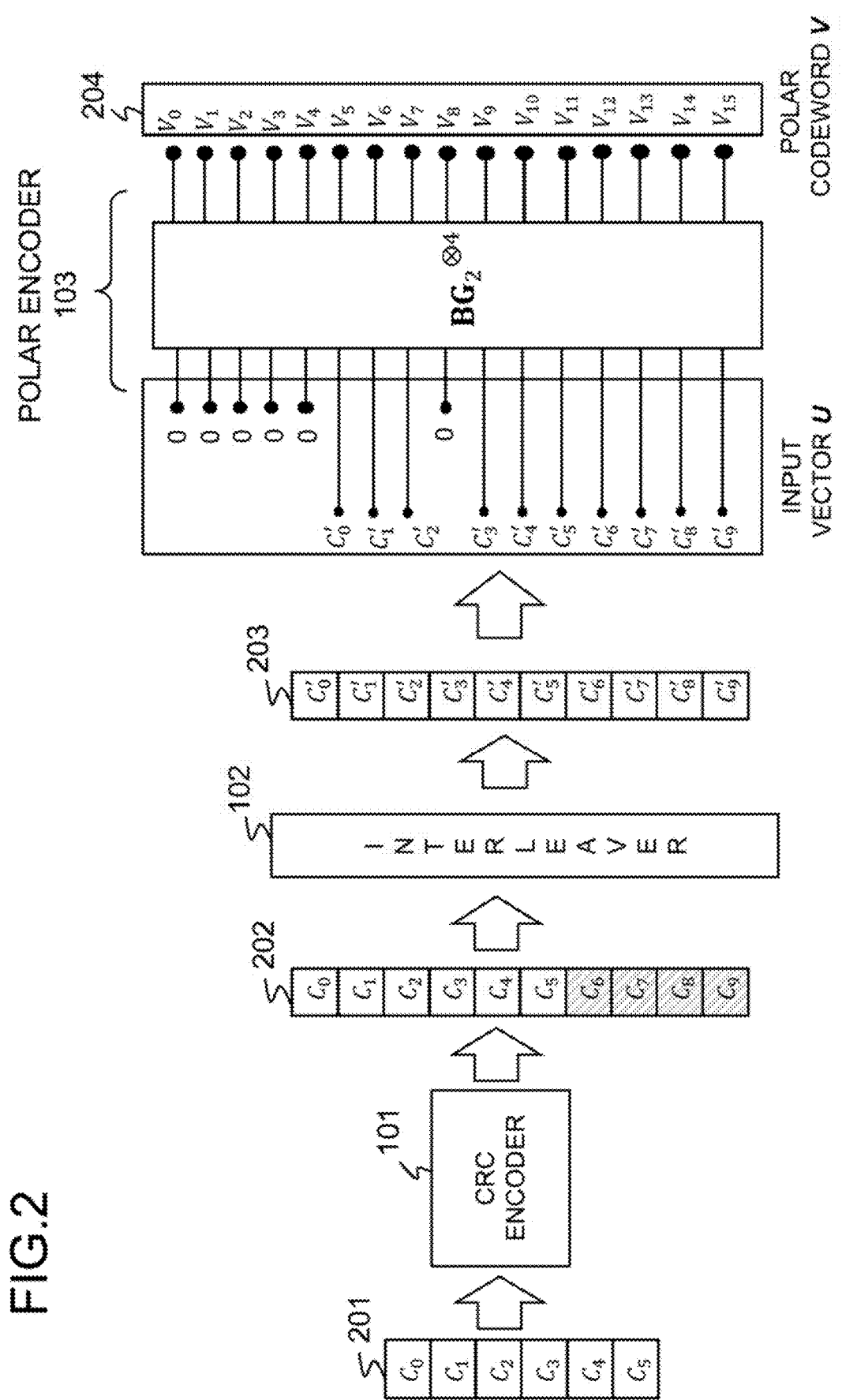
FIG. 2 is a schematic diagram illustrating an encoding procedure of CRC-concatenated polar codes in the encoder shown in FIG. 1.

As illustrated in FIG. 2, the message string 201 consisting of, e.g. six information bits ($C_0$, $C_1$, $C_2$, $C_3$, $C_4$, $C_5$) is fed to a CRC encoder 101. The output of the CRC encoder 101 is a CRC codeword 202 consisting of 10 bits, the first six bits being the information bits same as in 201 and the last four bits ($C_6$, $C_7$, $C_8$, $C_9$) are CRC bits. The CRC codeword 202 is fed as input to an interleaver 102, which performs an interleaving operation according to at least one of the interleaver-1 and the interleaver-2. The output of the interleaver 102 is shown by reference numeral 203 where the ten bits are indicated by ($C'_0$, $C'_2$, $C'_3$, $C'_4$, $C'_5$, $C'_6$, $C'_7$, $C'_8$, $C'_9$). The ten bits 203 are fed as input vector U to ten indices of non-frozen set of the polar encoder 103. The indices of frozen set of polar encoder 103 are filled with 0. Doing polar encoding by the polar encoder 103 multiplying the input vector with $$BG_2^{\otimes 4}, \quad (\text{Math. 2})$$

a CRC-concatenated polar codeword V ($V_0$, $V_1$, $V_2$, $V_3$, $V_4$, $V_5$, $V_6$, $V_7$, $V_8$, $V_9$, $V_{10}$, $V_{11}$, $V_{13}$, $V_{14}$, $V_{15}$) is obtained.

Figure 3:
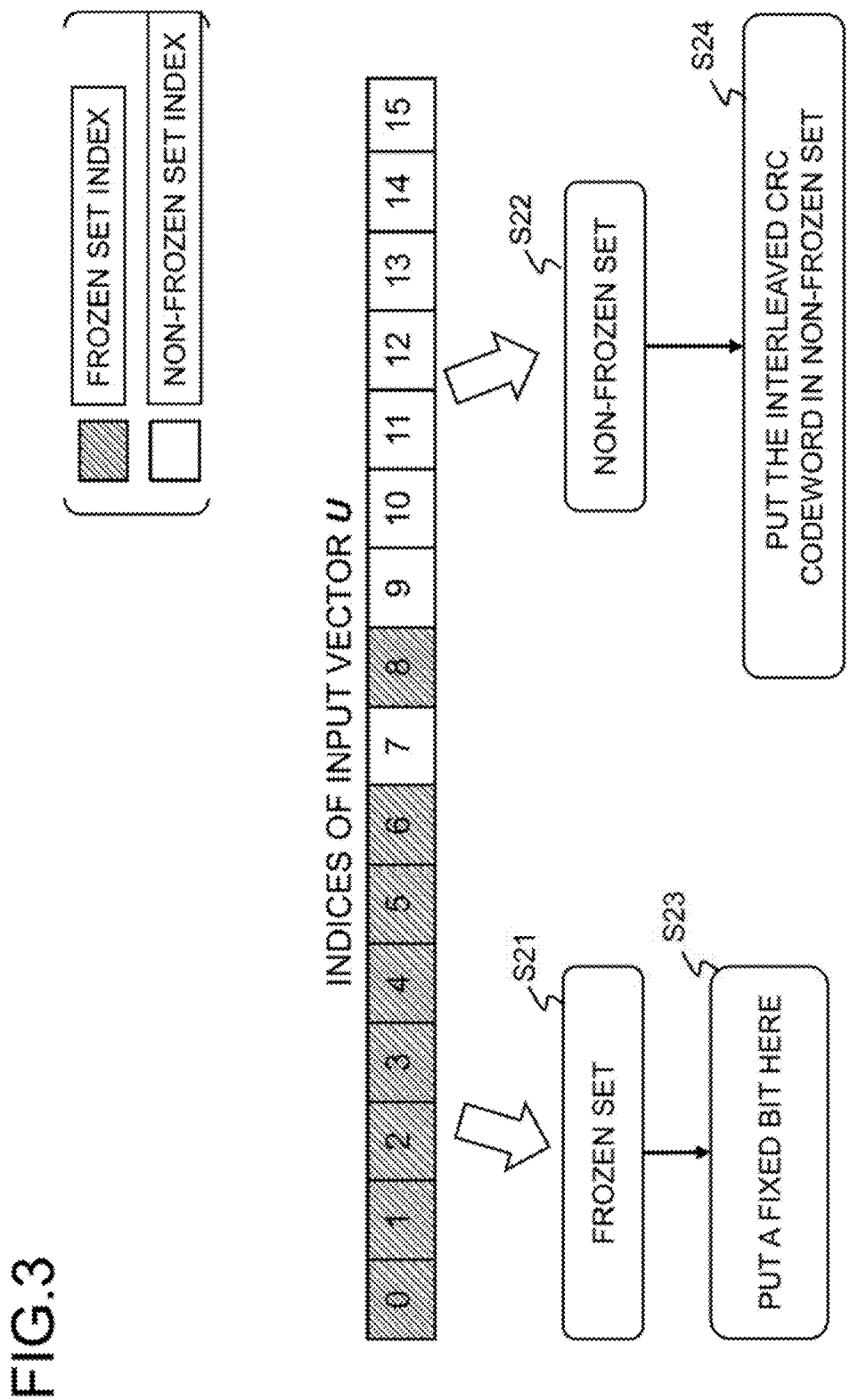
FIG. 3 is a schematic diagram illustrating an operation of determining the set of indices for frozen set and non-frozen set at the sender device shown in FIG. 2.
Figure 4:
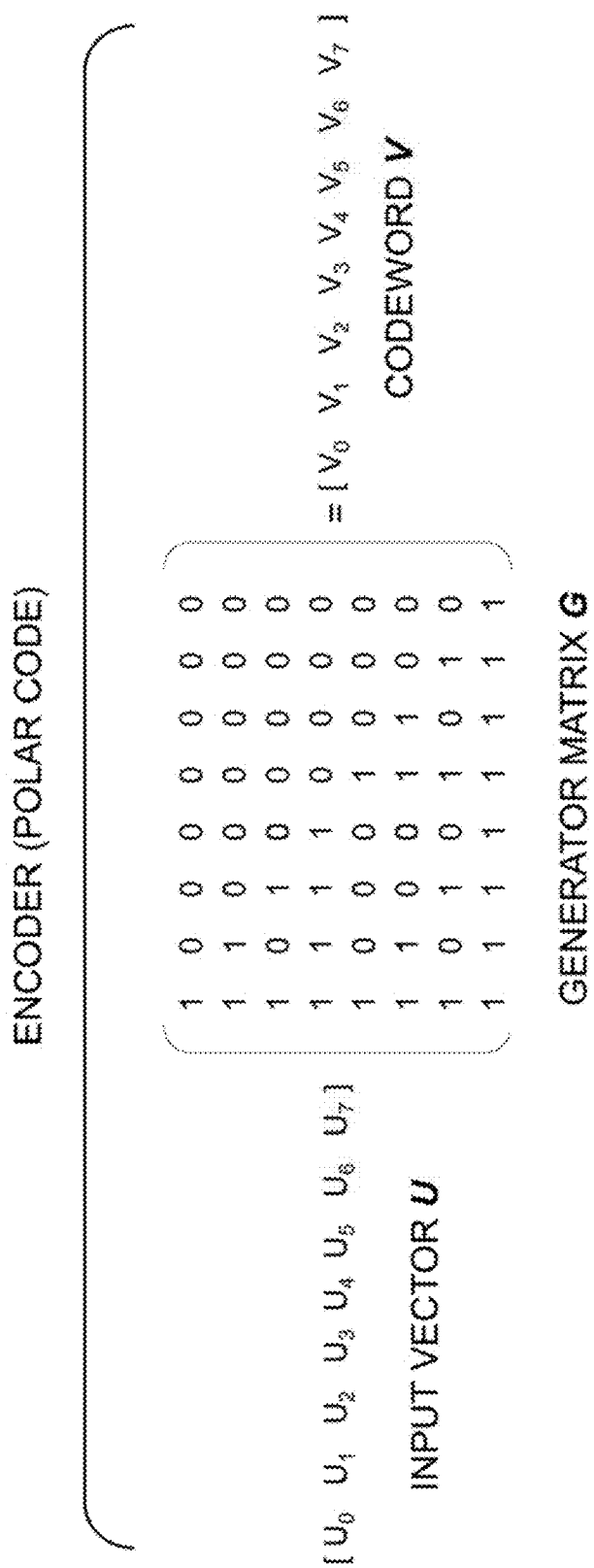
FIG. 4 is a schematic diagram illustrating an encoding operation using an example of the generator matrix of polar codes for generally explaining an encoding operation.

Referring to FIGS. 3 and 4, the polar encoder 103 may encode an input bit string according to the principle of polar encoding. To construct a polar code of length N, a sequence of indices $\{0,1,\ldots,N-1\}$ may be first sorted based on their reliability values. The N indices may be arranged in ascending/descending order of reliability. For instance, the N indices are arranged in descending order of decoding error probability or Bhattacharyaa parameter (Z). Note that Bhattacharyya parameter is used as a metric for decoding error probability. Such a sorted sequence of indices may be stored in memory. To construct a CRC concatenated polar code of length N consisting of K information bits and C CRC bits, the first N−(K+C) indices of the sorted sequence may be set to a fixed value (for example "0"). These indices are referred to as frozen bit. The last K+C bits that have relatively higher reliability values as compared to indices in the frozen set may be referred to as non-frozen set. An example is shown illustrated using FIG. 3. For N=16 and K+C=8, the indices 0, 1, 2, 3, 4, 5, 6, 8 may be included in frozen set S21 (shown as shaded). The indices 7, 9, 10, 11, 12, 13, 14, 15 may be included in the non-frozen set S22. The indices in frozen set may be filled with a fixed bit (for example, "0") as shown in S23. The output of the interleaver 102 may be put in the indices of non-frozen set as shown in S24. Thus by performing step S23 and S24, an input vector U may be obtained. As illustrated in FIG. 4, the input vector U can be multiplied to a generator matrix G to output a codeword V. The generator matrix G may be represented as (Math. 3)

$$G = B_2^{\otimes n} \qquad (1),$$

where B is a N×N bit-reversal permutation matix, $n = \log_2 N$, $G_2^{\otimes n}$ is the $n^{th}$ Kronecker power of $G_2$.

Some variants of embodiment may use the equation (1). Hereinafter, exemplary embodiments of the present invention will be discussed in its complete details with accompanying figures and finally explained with an exemplary scenario. The embodiment described herein is only illustrative of some specific representations of the invention acknowledging the fact that the inventive concepts can be embodied in a wide variety of contexts. Thus the exemplary embodiment does not limit the scope of the present invention. In the embodiments as described below, blocks similar to those previously described with reference to FIG. 1 are denoted by the same reference numerals and their details are omitted.

2. FIRST EXEMPLARY EMBODIMENT

Figure 5:
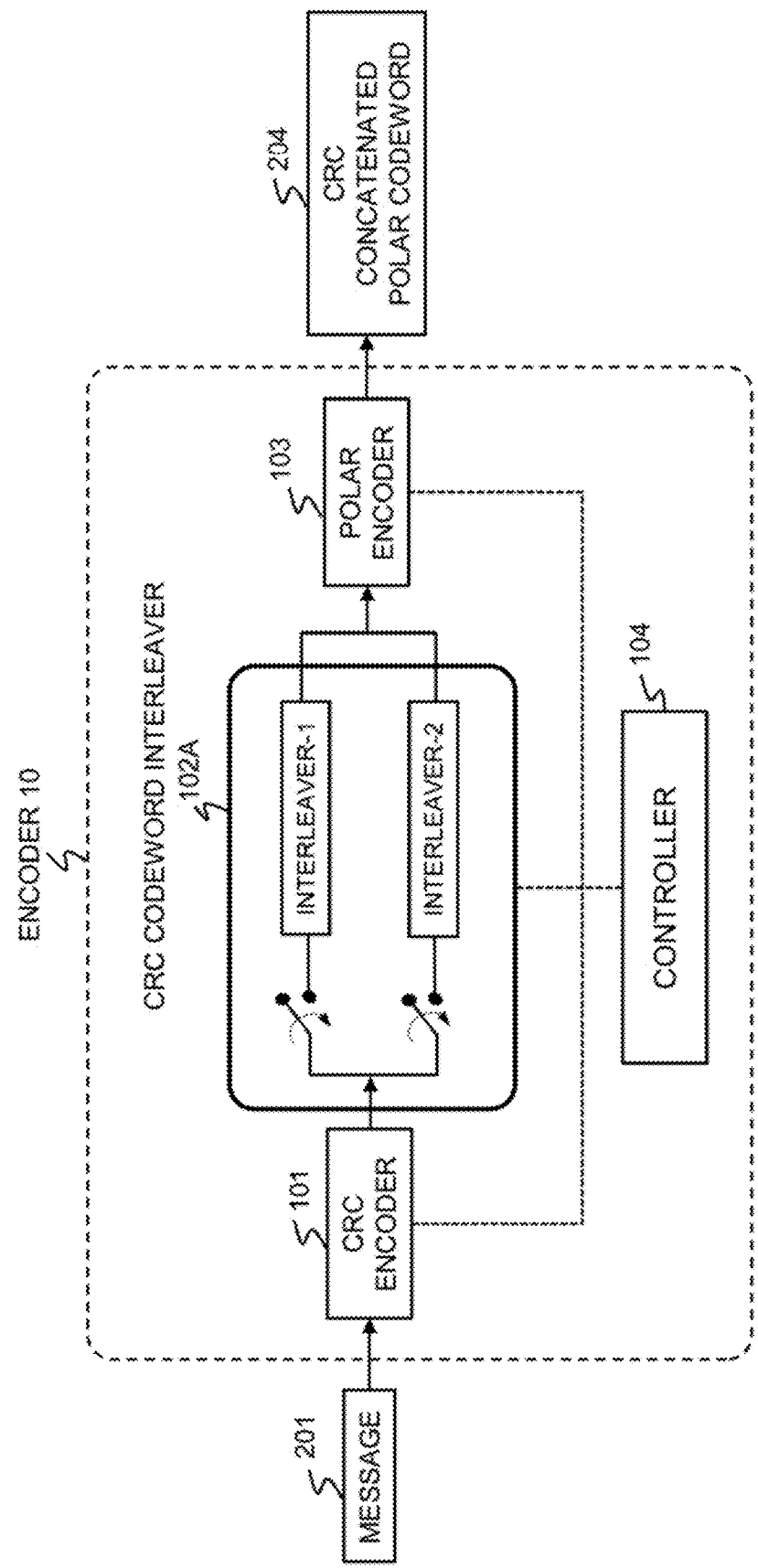
FIG. 5 is a schematic diagram illustrating the configuration of an encoder according to a first exemplary embodiment of the present invention.

As illustrated in FIG. 5, the encoder 10 has functions of a CRC encoder 101, an interleaver 102A and a polar encoder 103. The interleaver 102A implements the interleaver-1 for early termination and the interleaver-2 for good error detection. The controller 104 of the encoder 10 instructs the interleaver 102A to select at least one of the interleaver-1 and the interleaver-2. These interleavers will be described in details.

2.1) Interleaver-1 for Early Termination

First we introduce a few notations that will be used in the following discussion. Let N, K and C denote the length of polar code, information length and number of CRC bits as before. Let d be the number of CRC bits that are desired to be interleaved. P=($p_0$, $p_1$, ..., $p_{K+C-1}$) be a set containing the error probabilities of the indices in the non-frozen set, |P|=K+C where |·| denotes cardinality of a set. g(x) be a selected CRC polynomial, H=[$h_{ij}$] be a C×(K+C) parity check matrix of the CRC code, $I_1$ is an array of length K+C to store an interleaver pattern. $I_1$(m) denotes m-th element of $I_1$. A={0, 1, ..., K+C−1} is a set of integers, $$wt_j = \Sigma_{i=0}^{C-1} h_{ij}, \text{ where } 0 \le j < K+C \qquad (\text{Math. 4})$$

denotes the weight of j-th column in the H matrix, W={$w_0$, $w_1$, ..., $w_{K+C-1}$} is the set of column weights of H matrix. If X is an array, then X(i) or $X_i$ may denote i-th element of the array. This convention of notation is used throughout this document. An interleaving pattern for CRC codeword aiming good early termination may be obtained by the following algorithm.

1. Input⟨K, C, g(x), P, d⟩, (Math. 5)

initialize m = 0, initialize $I_1$ = (0, 0, ... , 0)

2. Compute H matrix.

3. for (i = 0; i < d; i++){

4. for (j = 0; j < K + C; j++){

5. if ($h_{ij}$ == 1) && ($h_{ij}$ ≠ 1 ∀ 0 ≤ t < i){

6. $I_1(m) = j$;

7. m++;

8. }

9. }

10. }

11. for (u = 0; u < K + C; u++){

12. if (u ∉ $I_1$) $I_1(m) = u$;

13. m++;

14. }

15. Output: $I_1$

In the above-described algorithm, the method may compute a parity check matrix H of the CRC code at first. A technique to compute the H matrix will be discussed later. Now a method to generate the interleaver-1 using H matrix will be described briefly and a detailed explanation on how to construct the interleaver-1 will be described later.

In the above-described algorithm, if d CRC bits are desired to be interleaved, then some column operation may be performed on the first d rows of H. Such column operations may be done as follows: In the first row, all columns that have a value 1 may be pushed to the leftmost positions of the H matrix. Meaning, after the column permutation operation at the first row, the first row may have consecutive 1s at the beginning, followed by consecutive 0s till the end. In the second row, all those columns that have value 1 in the second row but value 0 in the first row may be pushed to consecutive positions right after the column that has the last 1 in first row. Similarly in the third row, all those columns that have value 1 in the third row but value 0 in first and second row may be pushed to consecutive positions right after the column that has the last 1 in second row. By performing such column permutations on the first d rows of H matrix and storing the column indices post-permutation, it is possible to obtain an interleaving pattern. After this, the indices of remaining columns of H that are left un-permuted, if any, may be stored in their natural order at the end of $I_1$. Thus, a first interleaving pattern for CRC codeword may be obtained. The algorithm may be also described in the form of a flowchart as shown in FIG. 6.

Figure 6:
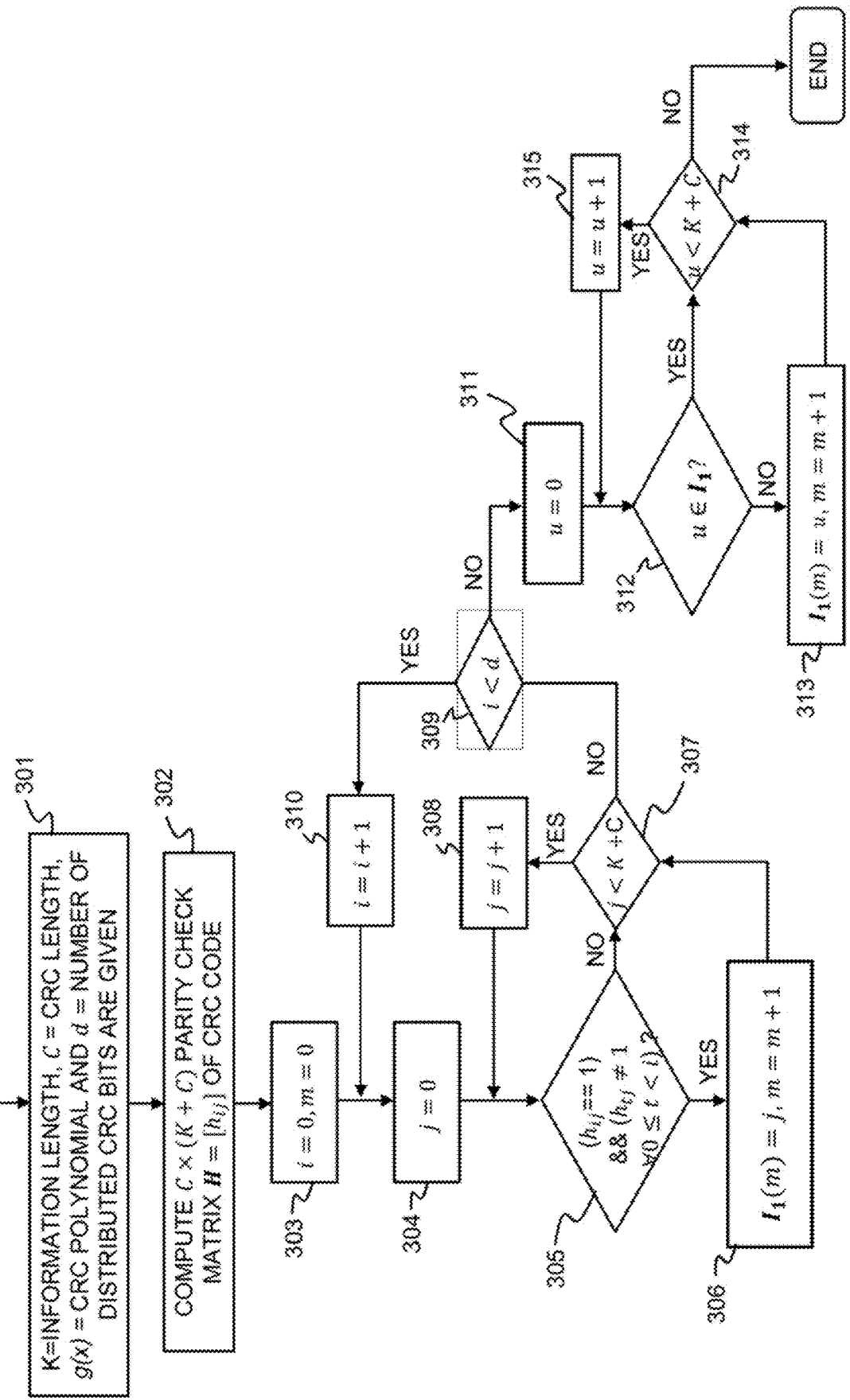
FIG. 6 is a flowchart illustrating an operation of determining an interleaver-1 in the encoder shown in FIG. 5.

As illustrated in FIG. 6, the first interleaver-1 is generated. The information length K, CRC length C, CRC polynomial g(x) and the number of CRC bits that are desired to be interleaved d are fed as input to the method (operation 301). A parity-check matrix may be computed in operation 302 according to the technique which will be described using FIG. 13. Then for each row starting from row i=0 till row i=d−1 (operations 303, 309, 310), the columns that have value 1 in that row but value 0 in all previous rows are selected (operation 305) and the column indices are stored in the interleaver array (operation 306). In each row from 0 to d−1, these operations 305 and 306 are done on all columns j=0 till j=K+C−1 (operations 304, 307, 308). After i has been equal to or greater than d (NO of operation 309), all those columns that are not present in the interleaver yet (operation 312) are selected and stored in the interleaver $I_1$ (operation 313). Thus a first interleaver may be obtained in $I_1$.

As described above, CRC detection will be possible during the SC/SCL decoding process. Thus it will not be required to wait till the SC/SCL decoding is completed to perform CRC check, resulting in reduced latency and power consumption.

2.2) Interleaver-2 for Good Error Detection

Now we introduce a technique of interleaving the CRC codeword prior to polar encoding that may produce good error detection rate. Use the same notations as before. Let $I_2$ denotes an array of length K+C to store an interleaving pattern. Then an interleaving pattern for CRC codeword aiming good error detection rate may be obtained by the following algorithm. Here, Greek character "Phi" denotes NULL.

1. Input⟨K, C, g(x), P, d⟩, (Math. 6)

initialize $I_2$ = [0, 0, ... , 0]

2. Compute H matrix.

3. for (i = 0; i < K + C; i++){

4. m = argmax$_{0≤j<K+C}w_j$ 5. n = argmax$_{0≤j<K+C}p_j$

6. $I_2(n) = m$;

7. $w_m$ ← ∅, $p_n$ ← ∅;

8. }

9. Output: interleaver

In the above-described algorithm, the method may compute the column weights of each column of H matrix. The column indices may be sorted in descending order of their column weights. Also the indices of non-frozen set may be sorted in descending order of their error probabilities as described before (see FIGS. 3 and 4). Then the column with highest column weight may be permuted to the index position that corresponds to highest error probability. Thus, the second interleaver $I_2$ may be obtained. The algorithm may be also described in the form of a flowchart as shown in FIG. 7.

Figure 7:
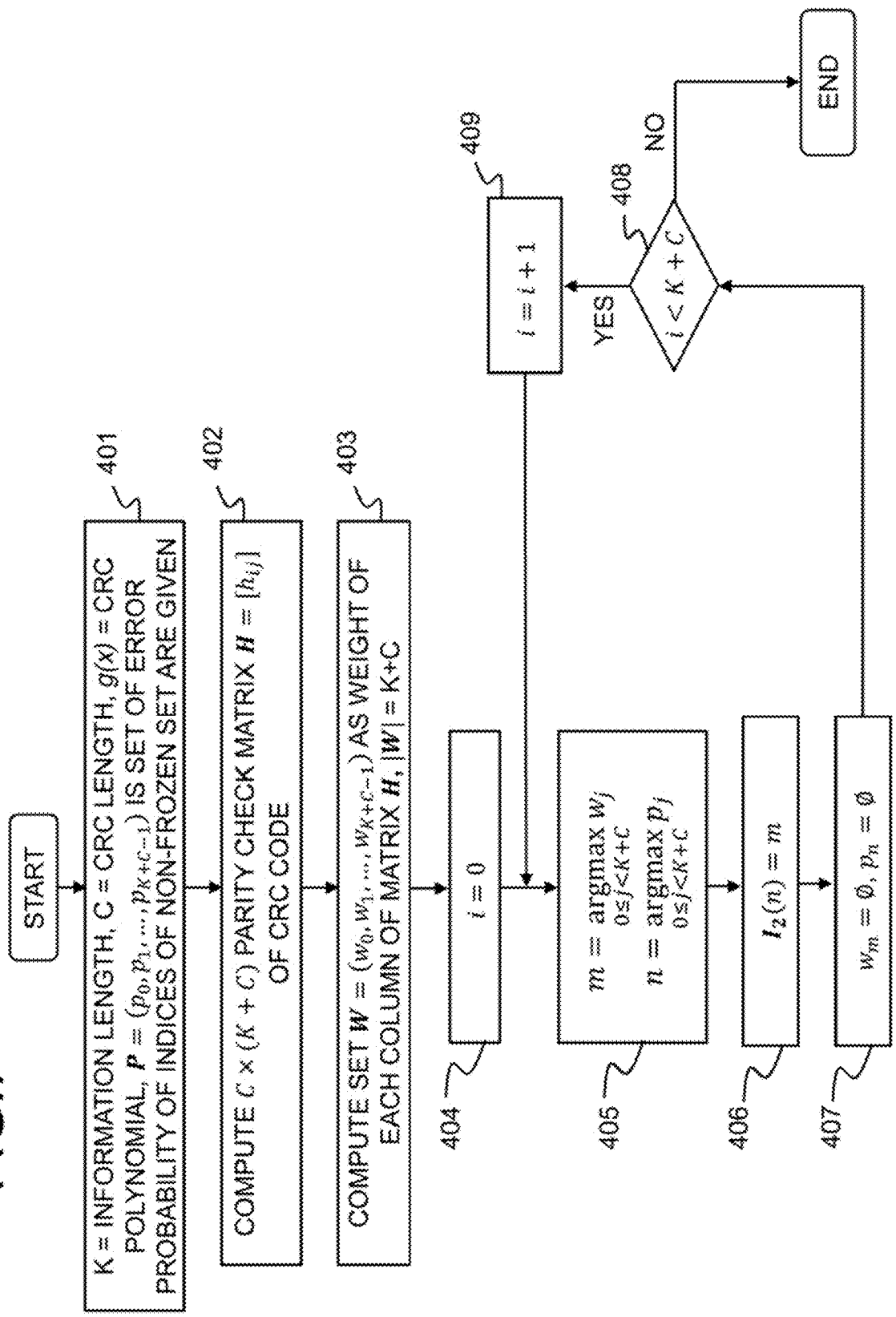
FIG. 7 is a flowchart illustrating an operation of determining an interleaver-2 in the encoder shown in FIG. 5.

With reference to FIG. 7, an exemplary method for generating a second interleaver-2 will be illustrated. The information length K, CRC length C, CRC polynomial g(x) and the set of error probabilities of the indices in non-frozen set are fed as input to the method (operation 401). A parity-check matrix may be computed in operation 402 according to the technique which will be described using FIG. 13. The weight of each of the K+C columns of the parity check matrix may be calculated and stored (operation 403). Then the index corresponding to the highest column weight is interleaved to an index corresponding to the highest error probability (operations 405-407). Thus a second interleaver may be obtained in $I_2$.

Figure 8:
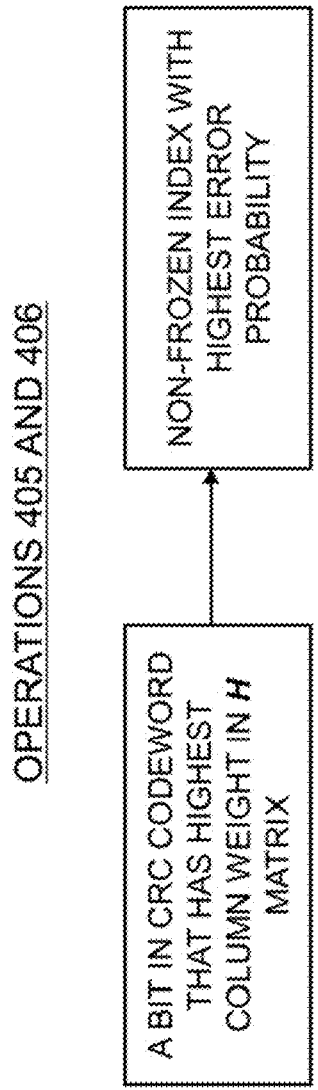
FIG. 8 is a diagram illustrating operations 405 and 406 of interleaver-2 shown in FIG. 7.

The operations 405 and 406 (steps 4-6 in the algorithm) are based on the fundamental design principle of the second interleaver-2. As illustrated in FIG. 8, an index that has highest column weight in the parity check matrix of CRC is interleaved to another index that has highest error probability. Accordingly, it is possible to construct a CRC-concatenated polar codes that can restrict a potential rise in undetected error rate.

2.3) Encoding Operation

As described above, the interleaver 102A of the encoder 10 includes different types of interleavers such as the interleaver-1 and the interleaver-2. The controller 104 controls the interleaving operation of the interleaver 102A such that at least one of the different types of interleavers is selected or both are sequentially selected.

Figure 9:
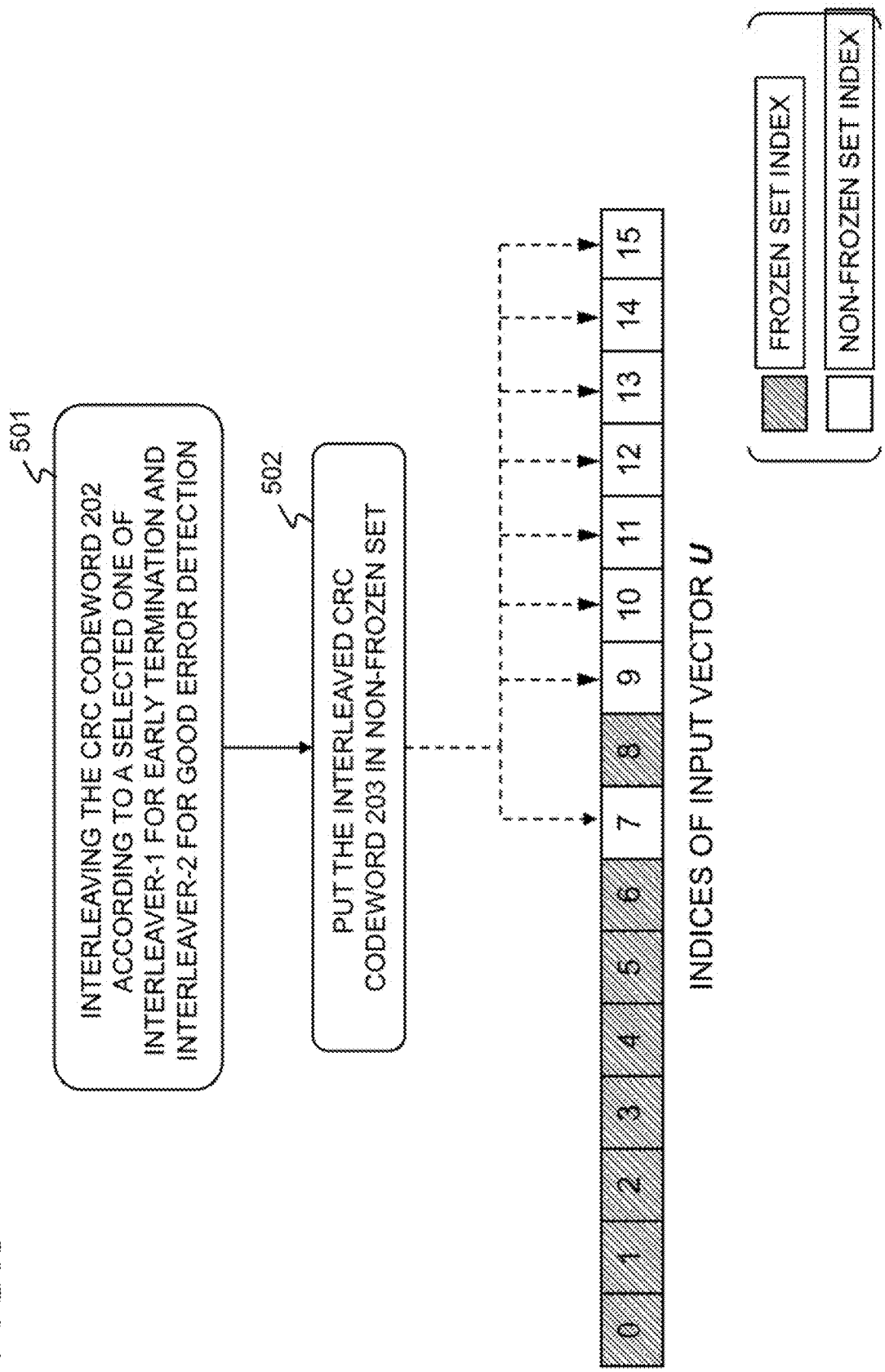
FIG. 9 is a flowchart illustrating an interleaving operation of interleaver-1 or interleaver-2 in the encoder shown in FIG. 5.

As illustrated in FIG. 9, the controller 104 instructs the interleaver 102A including the interleaver-1 for early termination and the interleaver-2 for good error detection to select at least one of the interleaver-1 and the interleaver-2. Under the control of the controller 104, the interleaver 102A interleaves the CRC codeword 202 received from the CRC encoder 101 according to a selected one of the interleaver-1 and the interleaver-2 (operation 501). The respective bits of the interleaved CRC codeword 203 are put in the indices of non-frozen set of the polar encoder 103 (operation 502).

When the interleaver 102A selects the interleaver-1, the bits of the CRC codeword are interleaved according to the interleaving pattern of the interleaver-1 to achieve the good early termination, and the interleaved CRC codeword 203 is fed as input to the indices of non-frozen set of the polar encoder 103.

When the interleaver 102A selects the interleaver-2, the bits of the CRC codeword are interleaved according to the interleaving pattern of the interleaver-2 with interleaving the index corresponding to the highest column weight of H matrix to an index corresponding to the highest error probability in the non-frozen set to achieve good error detection. The interleaved CRC codeword 203 is fed as input to the indices of non-frozen set of the polar encoder 103.

3. SECOND EXEMPLARY EMBODIMENT

Figure 10:
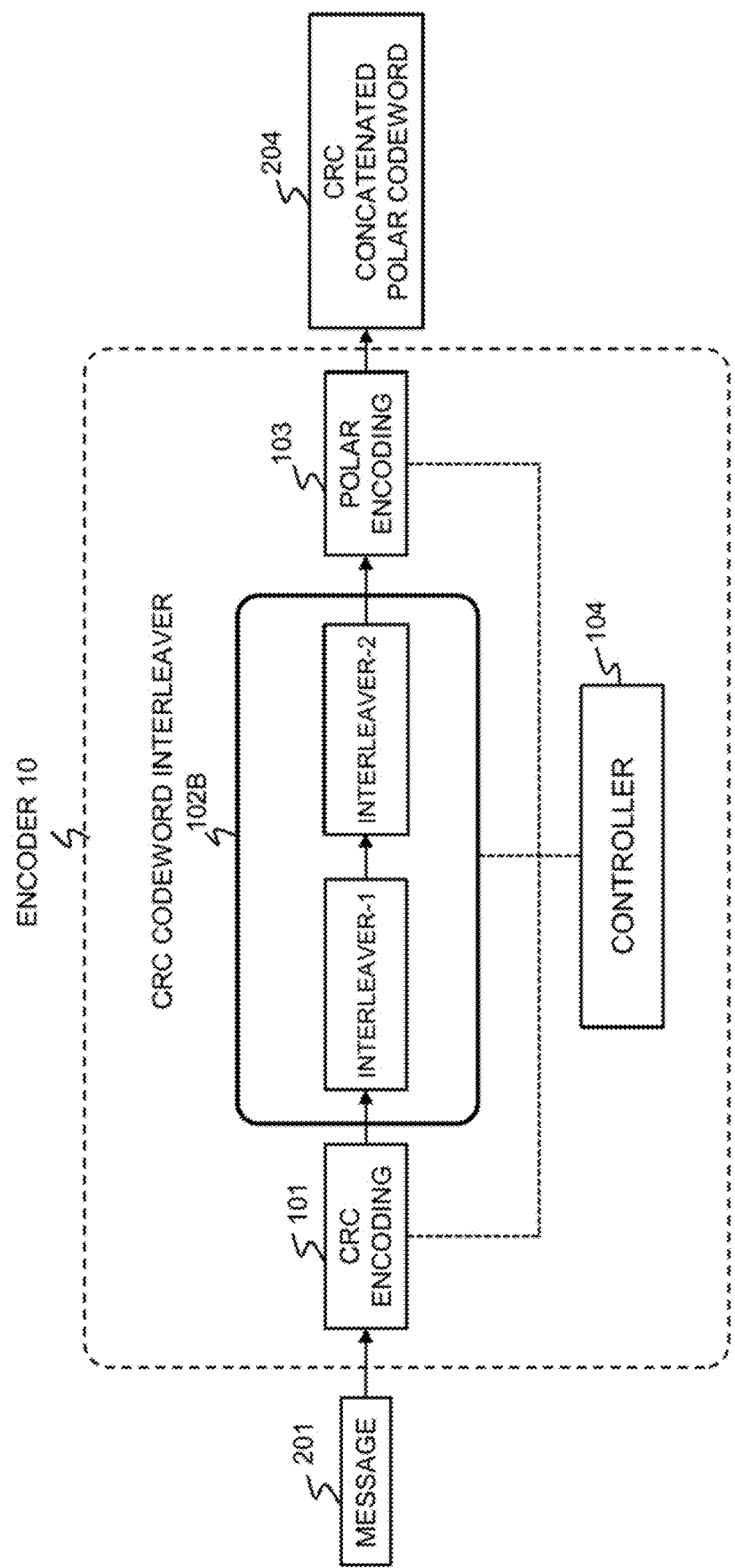
FIG. 10 is a schematic diagram illustrating the configuration of an encoder according to a second exemplary embodiment of the present invention.

As illustrated in FIG. 10 the encoder 10 has functions of a CRC encoder 101, an interleaver 102B and a polar encoder 103. The interleaver 102B implements the interleaver-1 for early termination and the interleaver-2 for good error detection. The controller 104 of the encoder 10 instructs the interleaver 102A to sequentially select the interleaver-1 and the interleaver-2 to provide concatenation of the interleaver-1 and the interleaver-2. A combination of the interleaver-1 and the interleaver-2 will be described in detail.

3.1) Combination of Early Termination and Good Error Detection

A combination of the interleaver-1 and the interleaver-2 may produce good early termination along with preventing excessive degradation in undetected error rate. Let $I_1$ be a first interleaver-1, $I_2$ be a second interleaver-2 and I be an array that stores a combined interleaving pattern, and size of I is denoted by |I|, $|I_1|+|I_2|=|I|=K+C$. The concatenation of $I_1$ and $I_2$ is denoted by $I_1 \cdot I_2$. Then an interleaving pattern for CRC codeword aiming both early termination and good error detection may be obtained by the following algorithm.

1. Input$\langle K, C, g(x), P, d\rangle$, initialize $m = 0$, (Math. 7)

initialize $I_1 = (0, 0, \ldots, 0)$, $I_2 = (0, 0, \ldots, 0)$

2. Compute $H$ matrix.

-continued 3. for $(i = 0; i < d; i++)\{$ 4. for $(j = 0; j < K + C; j++)\{$ 5. if $(h_{ij} == 1) \&\& (h_{tj} \neq 1 \forall 0 \leq t < i)\{$ 6. $I_1(m) = j;$ 7. $m++;$

8. }

9. }

10. }

11. $S \leftarrow A \setminus I_1, s = sizeof(S)$ 12. for $(i = 0; i < s; i++)\{$ 13. $m = \mathrm{argmax}_{0 \leq j < K+C, j \in S} w_j$ 14. $n = \mathrm{argmax}_{0 \leq j < K+C, j \in S} p_S(j)$ 15. $I_2(n) = m;$ 16. $w_m \leftarrow \emptyset, p_n \leftarrow \emptyset;$

17. }

18. Output: $I = I_1 \cdot I_2$

In the above-described algorithm, the same notations are used as before and let A be defined as a set of integers from 0 to K+C−1. The first half (steps 2-10) and the second half (steps 12-17) correspond to the interleaver-1 and the interleaver-2, respectively. In this example, the interleaver-1 is applied to d CRC bits of the CRC codeword to be distributed and the interleaver-2 is applied to the remaining bits after the last CRC bit interleaved by the interleaver-1 in the CRC codeword. The algorithm may be also described in the form of a flowchart as shown in FIG. 11.

Figure 11:
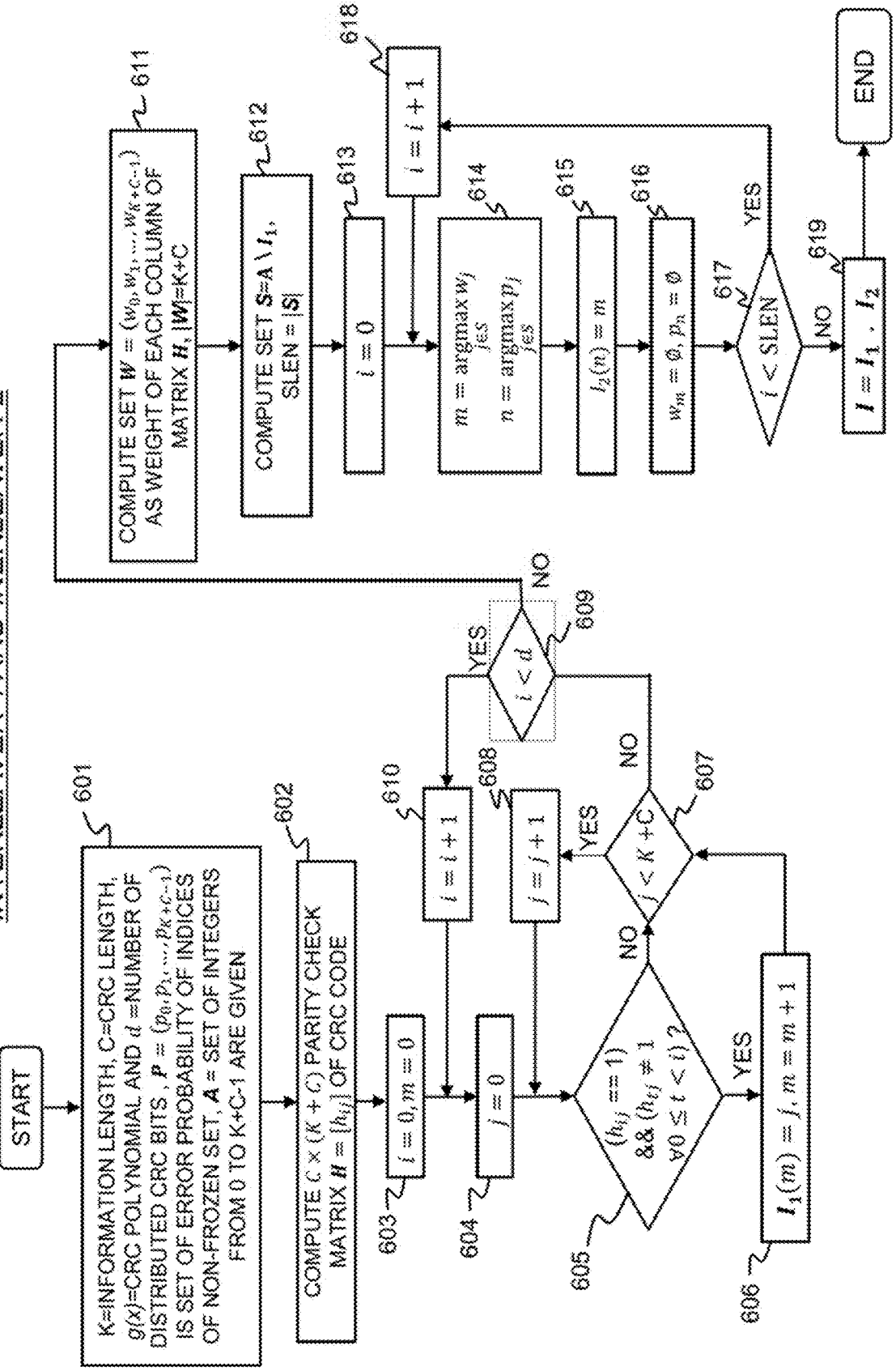
FIG. 11 is a flowchart illustrating an operation of determining a combination of interleaver-1 and interleaver-2 in the encoder shown in FIG. 10.

With reference to FIG. 11, an exemplary method for generating an interleaver by combination of the first interleaver-1 and the second interleaver-2 will be illustrated. The information length K, CRC length C, CRC polynomial g(x), number of CRC bits that are desired to be interleaved d, set of error probabilities of the indices in non-frozen set P and a set A of integers from 0 to K+C−1 are fed as input to the method (operation 601). A parity-check matrix H may be computed in operation 602 according to the technique which will be discussed using FIG. 13. Then for each row starting from row i=0 till row i=d−1 (operations 603, 609, 610), the columns that have value 1 in that row but value 0 in all previous rows are selected (operation 605) and the column indices are stored in the interleaver array $I_1$ (operation 606). In each row from 0 to d−1, this operation is done on all columns j=0 till j=K+C−1 (operations 604, 607, 608).

Next, the weight of each of the K+C columns of the parity check matrix H may be calculated and stored (operation 611). A set S is computed by subtracting the set $I_1$ from set A. Let the size of set S be SLEN. Then an index in S corresponding to the highest column weight is interleaved to an index corresponding to the highest error probability (operations 614, 615, 616). The operations 614, 615 and 616 may thus be repeated for SLEN times (operations 617, 618) to generate an interleaver pattern called $I_2$ (operation 615). A combined interleaver I may be obtained by concatenating a first interleaver $I_1$ and a second interleaver $I_2$ (operation 619). A more detailed explanation on how to construct the combined interleaver I will be described later.

3.2) Encoding Operation

As described above, the interleaver 102A of the encoder 10 includes different types of interleavers such as the interleaver-1 and the interleaver-2. The controller 104 controls the interleaving operation of the interleaver 102A as follows.

Figure 12:
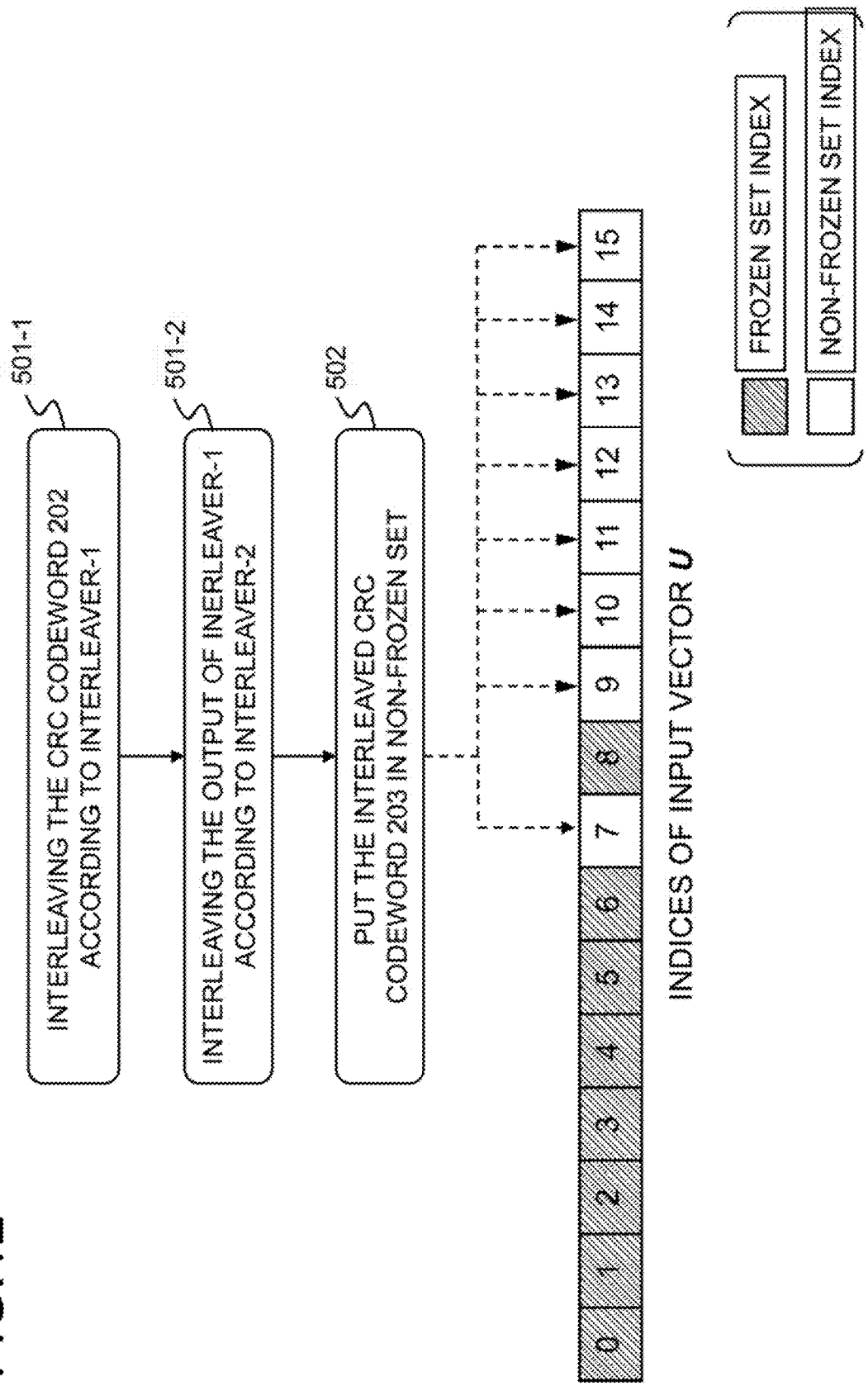
FIG. 12 is a flowchart illustrating a combined interleaving operation of interleaver-1 and interleaver-2 in the encoder shown in FIG. 10.

As illustrated in FIG. 12, the controller 104 instructs the interleaver 102A to interleave the CRC codeword 202 received from the CRC encoder 101 according to the interleaver-1 (operation 501-1). Subsequently, the controller 104 instructs the interleaver 102A to interleave the resulting CRC codeword interleaved by the interleaver-1 according to the interleaver-2 (operation 501-2). More specifically, the interleaver-2 is applied to the remaining bits after the last CRC bit interleaved by the interleaver-1 in the CRC codeword. The respective bits of the interleaved CRC codeword 203 are put on the indices of non-frozen set of the polar encoder 103 (operation 502).

As described above, it will be possible to construct a CRC-concatenated polar codes that can detect decoding error before completion of SC/SCL decoding, while restricting a potential rise in undetected error rate. In other words, by concatenating the interleaver-1 and the interleaver-2, good early termination can be achieved while preventing excessive degradation in undetected error rate.

4. COMPUTATION OF PARITY CHECK MATRIX

A detailed explanation on how to compute a parity check matrix H will be made by referring to FIG. 13.

Figure 13:
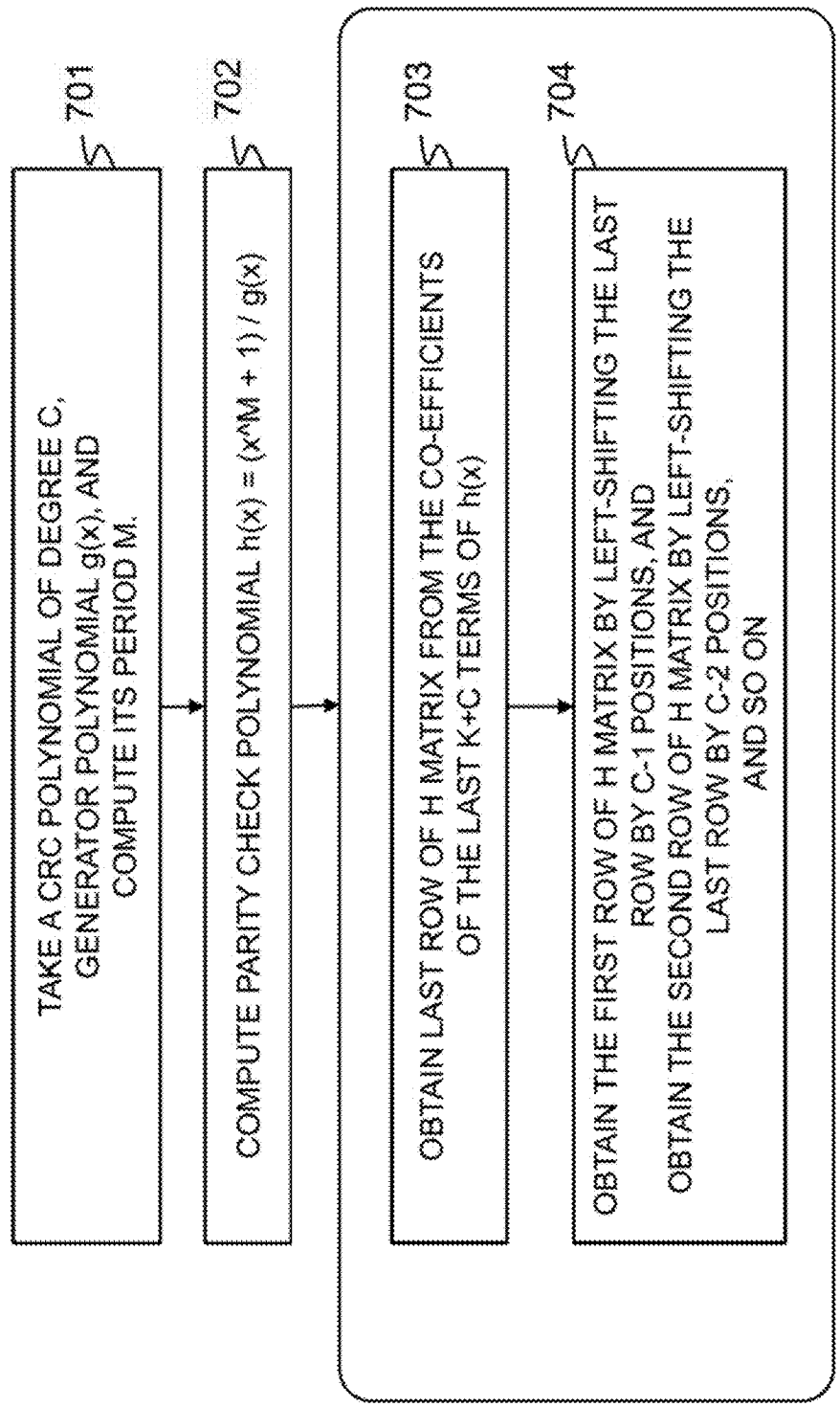
FIG. 13 is a flowchart illustrating an operation of determining a parity-check matrix in operations 302, 402 and 602 shown in FIGS. 6, 7 and 11, respectively.

As illustrated in FIG. 13, let g(x) denote a CRC polynomial of degree C. Let M denote the period of the generator polynomial which may be defined as the least positive integer such that g(x) divides $x^M-1$. Compute period M of the CRC polynomial g(x) (operation 701). A method to find the period M may fill the coefficients of the C+1 terms of g(x) in a shift register and do circular shift operation on the shift register till the initial array reappears. The number of shift operations may be counted as the period of g(x). Let h(x) denote a parity-check polynomial of the CRC. Then as shown in operation 702, h(x) may be obtained as $h(x)=(x^M+1)/g(x)$.

The last row of H matrix may be obtained from the coefficients of the last K+C terms of h(x) (operation 703). Then each of the above rows of H matrix starting from the second last row to the first row may be obtained by one left shift operation of the previous row (operation 704). For instance, the second last row may be obtained by one left shift of the last row; the first row may be obtained by the C−1 left shifts of the last row and so on. More specific procedure will be described below.

Example

Consider a polar code with code length N=64, information length K=32, number of CRC bits C=8, CRC polynomial is $g(x)=x^8+x^2+x+1$. Period M of g(x) may be obtained as 127 as discussed before. Parity-check polynomial h(x) can be obtained as $h(x)=(x^{127}+1)/(x^8+x^2+x+1)$. Clearly, h(x) is a polynomial of degree 119. Observe that, length of CRC codeword in this example is K+C=32+8=40. So an interleaver of length 40 will be required to interleave the CRC codeword. The last row of H matrix may be obtained from the coefficients of last 40 terms of h(x) which is "1000110011010000101011010101000111 000001". As described earlier, each of the upper rows of H may be obtained by appropriately left-shifting the last row. For example, the first row from top may be obtained by left-shifting the last row by C−1 places; second row from top may be obtained by left-shifting the last row by C−2 places and so on. The resulting H matrix may be as follows:

$$H = \begin{bmatrix} 0110100001010110101010001110000010000000 \\ 0011010000101011010101000111000001000000 \\ 1001101000010101101010100011100000100000 \\ 1100110100001010110101010001110000010000 \\ 0110011010000101011010101000111000001000 \\ 0011001101000010101101010100011100000100 \\ 0001100110100001010110101010001110000010 \\ 1000110011010000101011010101000111000001 \end{bmatrix}$$

(Math. 8)

5. EXAMPLE OF CONSTRUCTION OF INTERLEAVER-1

An example is introduced here to explain a construction of a first interleaver (Interleaver-1). Consider a case where it is desired that maximum number of CRC bits are distributed employing the interleaver-1. Then, column permutation operations may be performed on H matrix to form a permuted matrix H'. The column permutation procedure is as follows.

In the H matrix as mentioned above, the columns that have 1 in the first row of H are {1,2,4,9,11,13,14,16,18,20, 24,25, 26,32}. All of these fourteen columns may be shifted to the left of H matrix, i.e., they form the first fourteen columns of H'. Next, column permutation may be performed on the second row of H such that all those columns that have value 1 in the second row but value 0 in the first row are selected and positioned after the first fourteen columns. Thus, the ten columns {3,5,10,12,15,17,19,21,27,33} are placed after the first fourteen columns. Similarly, the five columns {0, 6, 22, 28, 34} have a value 1 in the third row, but value 0 in first and second rows. Thus they may be shifted after the first twenty four columns of H'. Doing similar operations on all rows, an H' matrix may be obtained as follows:

$$H' = \begin{bmatrix} 1111111111111000000000000000000000000000 \\ 0100001000011011111111110000000000000000 \\ 0010110111001010001000101111100000000000 \\ 1010001100000001010111101001011110000000 \\ 1100010011100001001100000111000101110000 \\ 0101001110010010000011000100011100101100 \\ 0010000001101110101110000100100001101010 \\ 0011100111010101000001111000001001001001 \end{bmatrix}$$

(Math. 9)

Thus an interleaving pattern of length 40 can be obtained from the column permutation order as follows:

$I_1$=(1,2,4,9,11,13,14,16,18,20,24,25,26,
32,3,5,10,12,15,17,19,21,27,33,0,6,22,28,
34,7,23,29,35,8,30,36,31,37,38,39), where the positions of the CRC bits {32, 33, 34, 35, 36, 37, 38, 39} are highlighted in bold font.

If only c bits of CRC are desired to be distributed using the first interleaver-1 where c<C, then the column permutation described before can be done on the top c rows of H matrix. An example is introduced here for c=3. Consider the same polar code parameters as described in the previous example: N=64, K=32, C=8, $g(x)=x^8+x^2+x+1$. The H matrix is same as before; column permutation is done on the top 3 rows as described earlier. No further column permutation is done on the remaining 5 rows. Thus, the following H' matrix may be obtained:

$$H' = \begin{bmatrix} 1111111111111100000000000000000000000000 \\ 0100001000011011111111110000000000000000 \\ 0010110111001010001000101111100000000000 \\ 1010001100000001010111101001011110000000 \\ 1100010011100001001100000111000101110000 \\ 0101001110010010000011000100011100101100 \\ 0010000001101110101110000010100001101010 \\ 0011100111010101000001111000001001001001 \end{bmatrix}$$ (Math. 10)

Accordingly, resulting interleaver-1 pattern $I_1$ may be obtained as follows:

$I_1$=(1,2,4,9,11,13,14,16,18,20,24,25,26,
32,3,5,10,12,15,17,19,21,27,33,0,6,22,28,
34,7,8,23,29,30,31,35,36,37,38,39).

6. EXAMPLE OF CONSTRUCTION OF INTERLEAVER-2

An example is introduced here to explain a construction of a second interleaver (Interleaver-2) according to an exemplary embodiment of the present invention. Consider a polar code with code length N=64, information length K=32, number of CRC bits C=8, CRC polynomial is $g(x)=x^8+x^2+x+1$ as before. The non-frozen set $(a_0, a_1, a_2, \ldots, a_{39})$ may consist of the indices (14, 15, 19, 21, 22, 23, 25, 26, 27, 28, 29, 30, 31, 35, 37, 38, 39, 41, 42, 43, 44, 45, 46, 47, 48, 49, 50, 51, 52, 53, 54, 55, 56, 57, 58, 59, 60, 61, 62, 63) while the frozen set $(b_0, b_1, b_2, \ldots, b_{39})$ may consist of the indices (0, 1, 2, 3, 4, 5, 6, 7, 8, 9, 10, 11, 12, 13, 16, 17, 18, 20, 24, 32, 33, 34, 36, 40). The H matrix is same as before. The column indices of H matrix may be sorted in descending order of column weights as follows: (4, 16, 18, 20, 2, 3, 5, 14, 15, 17, 19, 21, 25, 26, 27, 0, 1, 6, 7, 8, 9, 11, 13, 22, 23, 24, 28, 29, 30, 31, 32, 10, 12, 33, 34, 35, 36, 37, 38, 39). Next, the indices of non-frozen set may be sorted in descending order of error probabilities as follows:

$(a_0,a_2,a_3,a_1,a_1,a_{13},a_6,a_{24},a_{14},a_7,a_{15},a_{17},a_9,a_{18},a_{20},a_5,$
$a_{25},a_{26},a_{28},a_8,a_{32},a_{10},a_{39},a_{38},a_{37},a_{36},a_{35},a_{34},a_{33},$
$a_{31},a_{30},a_{29},a_{27},a_{23},a_{22},a_{21},a_{19},a_{16},a_{12},a_{11})$. (Math. 11)

Finally, an interleaver may be designed that shifts index 4 to $a_0$, index 16 to $a_2$, index 18 to $a_3$, index 20 to $a_4$, index 2 to $a_1$ and so on. Accordingly, resulting interleaver $I_2$ can be obtained as follows:

$I_2$=(4,2,16,18,20,0,5,17,8,25,11,39,38,3,15,19,37,21,
26,36,27,35,34,33,14,1,6,12,7,10,32,31,9,30,29,
28,24,23,22,13).

7. EXAMPLE OF COMBINATION OF INTERLEAVER-1 AND INTERLEAVER-2

An example is introduced here to explain a construction of a combination of a first interleaver (Interleaver-1) and a second interleaver (Interleaver-2) according to an exemplary embodiment of the present invention. Consider a polar code with code length N=64, information length K=32, number of CRC bits C=8, CRC polynomial is $g(x)=x^8+x^2+x+1$ as before. The non-frozen set and frozen sets are as described before, the H matrix is also same as before. Assume a case where c bits of CRC are desired to be distributed using the first interleaver; let c=3 here. Then column permutation may be performed on the top 3 rows of H and an first interleaver pattern may be obtained as follows: {1, 2, 4, 9, 11, 13, 14, 16, 18, 20, 24, 25, 26, 32, 3, 5, 10, 12, 15, 17, 19, 21, 27, 33, 0, 6, 22, 28, 34, 7, 8, 23, 29, 30, 31, 35, 36, 37, 38, 39}. Here, "34" is the 3$^{rd}$ CRC bit which is also the last interleaved CRC bit. Thus a first interleaving pattern, which is the output of the interleaver-1, may be considered as the following $I_1$={1, 2, 4, 9, 11, 13, 14, 16, 18, 20, 24, 25, 26, 32, 3, 5, 10, 12, 15, 17, 19, 21, 27, 33, 0, 6, 22, 28, 34}. The indices appearing after "34", i.e., {7, 8, 23, 29, 30, 31, 35, 36, 37, 38, 39} be labelled as $\{e_0,e_1,e_2,e_3,e_5,e_6,e_7,e_8,e_9,e_0,e_{10}\}$. (Math. 12)

The indices $\{e_0, e_1, \ldots, e_{10}\}$ may be sorted in descending order of error probability as follows:

$(e_0,e_1,e_{10},e_9,e_8,e_7,e_6,e_5,e_4,e_3,e_2)$. (Math. 13)

Next, the indices {7, 8, 23, 29, 30, 31, 35, 36, 37, 38, 39} are sorted in descending order of column weights of H matrix as follows: (7, 8, 23, 29, 30, 31, 35, 36, 37, 38, 39). Then, index 7 may be permuted to position of $e_0$, 8 to $e_1$, 23 to $e_{10}$, 29 to $e_9$ and so on. Thus a second interleaver pattern may be obtained as $I_2$={7, 8, 39, 38, 37, 36, 35, 31, 30, 29, 23}. A combined interleaver I may be obtained by concatenating $I_1$ and $I_2$ as follows:

I={1,2,4,9,11,13,14,16,18,20,24,25,26,32,3,5,10,12,
15,17,19,21,27,33,0.6,22,28,34,7,8,39,38,37,36,
35,31,30,29,23}. (Math. 14)

During SCL decoding, CRC checks may be performed at the positions highlighted in bold font, i.e., 32, 33 and 34. After that, the remaining bits may be decoded as usual. Once the entire frame has been decoded, CRC check of the remaining CRC bits 35, 36, 37, 38, 39 may be performed. Alternatively, in another variant of embodiment, it may also be possible to do a de-interleaving operation after the entire frame has been decoded so that the bits are restored to their original order (i.e., the bit order of CRC codeword before applying interleaver at the encoder). Then an usual CRC check may also be performed.

As discussed in the previous paragraph, a CRC check can be performed at the positions 32, 33, 34, without waiting for the entire frame to be decoded. If a decoding error is detected at any of these positions, then an early termination of the decoder may be performed. Early termination may be useful in various scenarios, especially in blind decoding. Blind decoding may be a technique where a receiver may want to know control information like coding and modulation parameters used by a transmitter. Depending on an instantaneous channel condition, a transmitter may use different values of modulation and coding parameters. Such parameters may not be informed to the receiver by explicit signaling. In such scenario, a receiver may try decoding a received frame multiple times using different values of parameters from a pool of such parameters. Once it succeeds in correctly decoding a frame using a specific value of parameters, it assumes to have known the parameters used by the transmitter. Hence, in blind decoding, a receiver may have to perform multiple decoding attempts before it knows the correct values of parameters. Early termination may be an essential requirement in such case to abort a decoding attempt as early as possible when error is detected. This can have impact on the total time spent by a receiver in blind decoding.

8. EXAMPLES

Hereinafter, a communication device to which the above-described exemplary embodiments of the present invention are applied will be discussed in its complete details with accompanying figures and finally explained with an exemplary scenario. The examples described herein are only illustrative of some specific representations of the invention acknowledging the fact that the inventive concepts can be embodied in a wide variety of contexts. Thus the examples do not limit the scope of the present invention.

Figure 14:
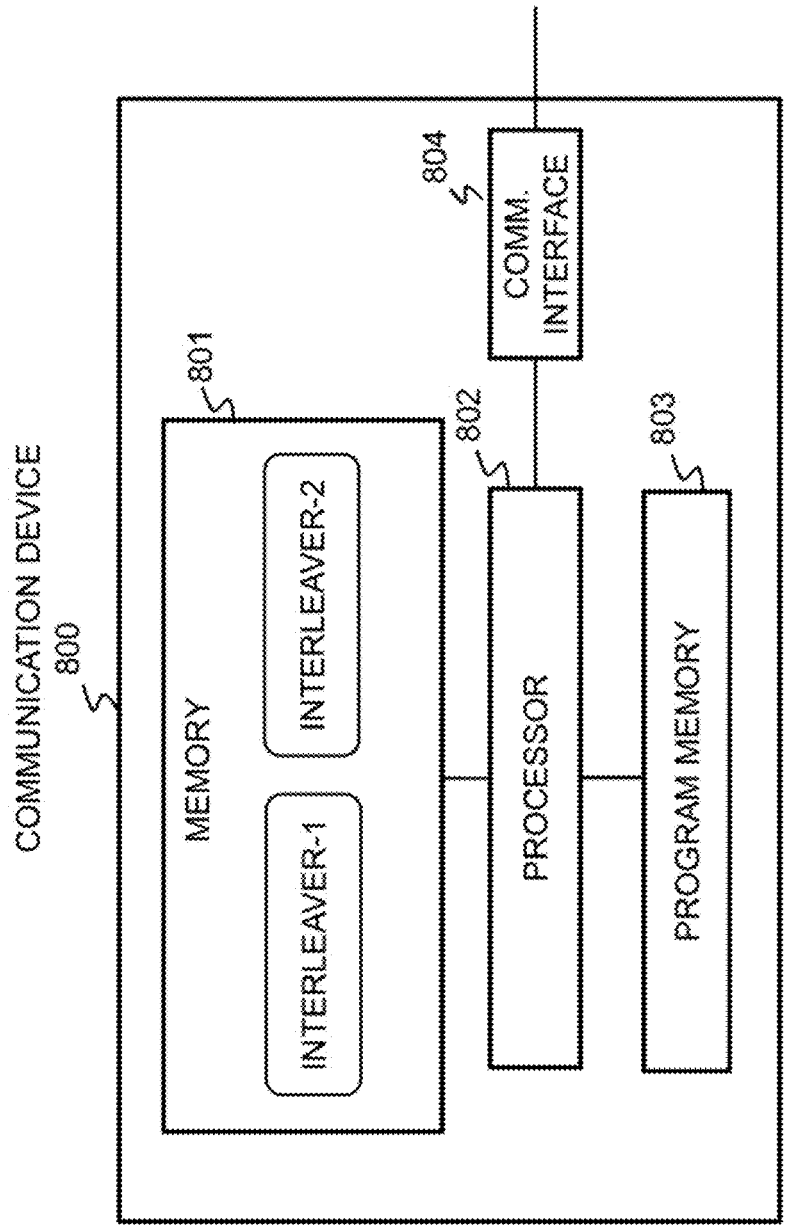
FIG. 14 is a block diagram illustrating an architecture of a communication device which can implement the method according to an exemplary embodiment of the present invention.

As illustrated in FIG. 14, a communication device 800 may be provided with a sender device and a receiver device. The sender device includes the function of interleaving the output of CRC encoder to construct CRC-concatenated polar codes as described above. The communication device 800 includes a memory 801, a processor 802, a program memory 803, a communication interface 804, and other units necessary for communication. The memory 801 stores the interleaver-1 and the interleaver-2, which are used for encoding and decoding. The processor 802 is configured to execute program instructions stored in the program memory 803 to perform the encoding function and the decoding function.

8.1) Sender Device

Figure 15:
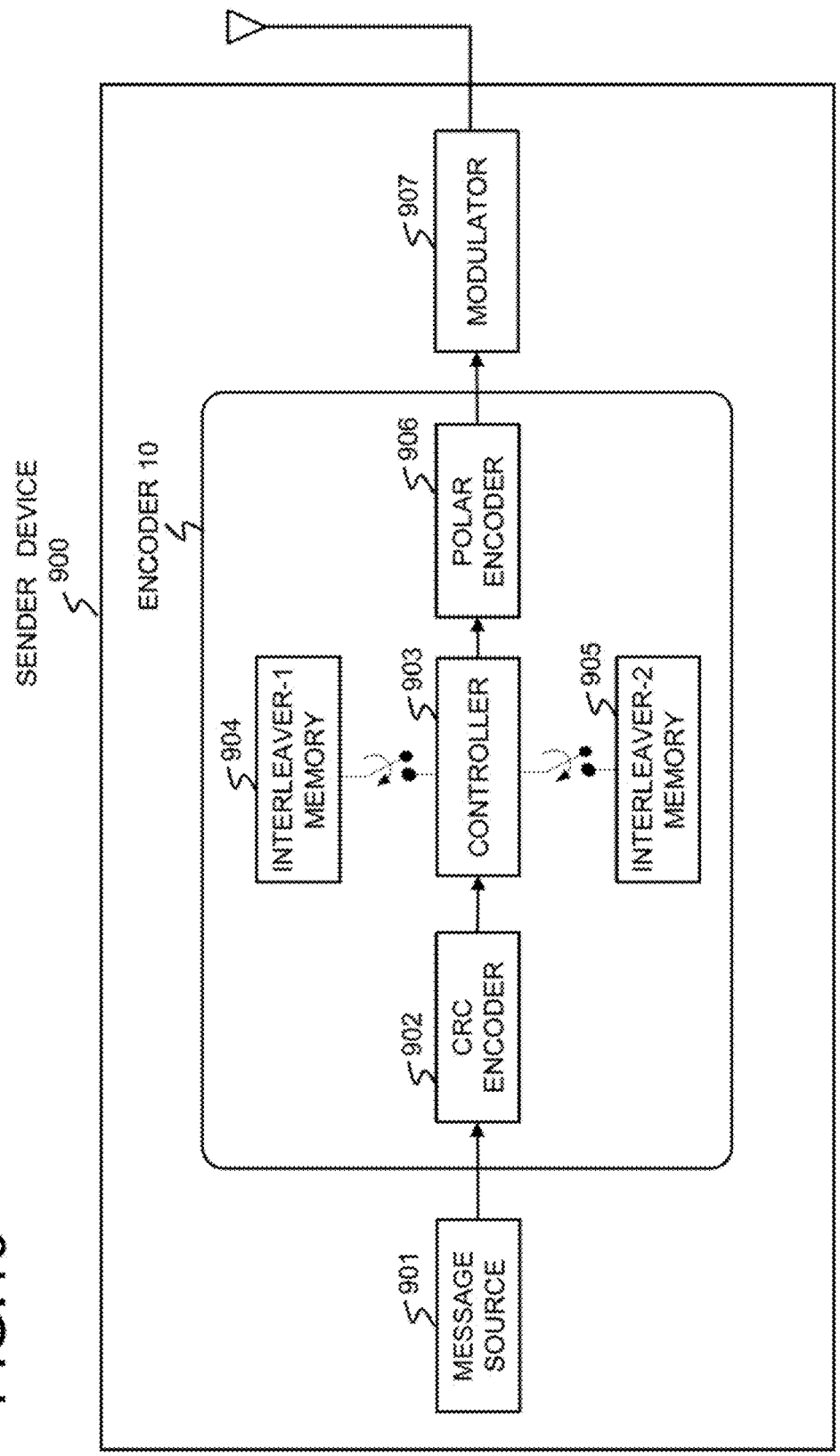
FIG. 15 is a block diagram illustrating an architecture of a sender device which is a first example of the communication device as shown in FIG. 14.

FIG. 15 shows the functional block diagram of a sender device 900 provided with data sending functions including a message source 901, CRC encoder 902, a controller 903, an interleaver-1 memory 904, an interleaver-2 memory 905, a polar encoder 906, and a modulator 907. The data sending functions may be implemented on a processor running respective programs stored in a memory device (not shown). Message source 901 may generate a binary message string 201 as shown in FIG. 1, without loss of generality. The CRC encoder 902 can generate a CRC codeword by operating on the message string 201. The output of the CRC encoder 902 may be sent to the controller 903 that is capable of doing an interleaving operation using at least one of the interleaver-1 pattern stored in the interleaver-1 memory 904 and the interleaver-2 pattern stored in the interleaver-2 memory 905 as described in the first exemplary embodiment or a combination of the two interleaving patterns as described in the second exemplary embodiment. Thus the controller 903 can interleave the output of the CRC encoder 902. The output of the controller 903 is send to the polar encoder 906 which performs encoding using a principle of polar codes. The output of the polar encoder 906 may be sent to the modulator 907 for modulation and then the output of the modulator 907 is sent to a radio-frequency unit for transmission (not shown).

In some variant of embodiment, the message source 901 may generate non-binary messages and the remaining functional blocks in FIG. 15 may be suitably modified for non-binary message.

8.2) Receiver Device

Figure 16:
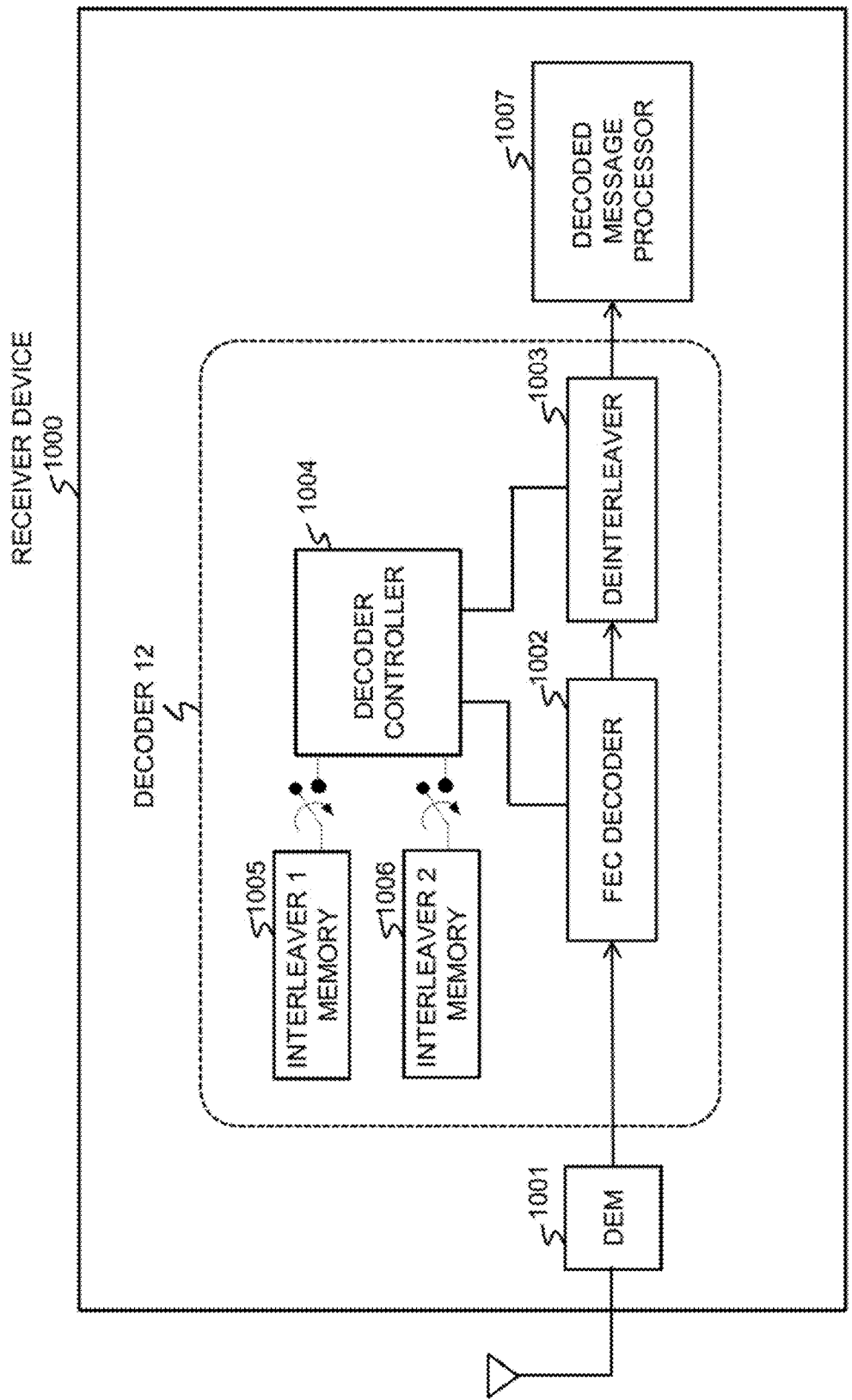
FIG. 16 is a block diagram illustrating an architecture of a receiver device which is a second example of a communication device according to an exemplary embodiment of the present invention.

As illustrated in FIG. 16, a receiver device 1000 is provided with data receiving functions including a demodulator 1001, the decoder 12 and a decoded message processor 1007. The decoder 12 includes a Forward Error Correction (FEC) decoder 1002, a de-interleaver 1003, a decoder controller 1004, an interleaver-1 memory 1005 and an interleaver-2 memory 1006. The decoder 12 and the decoded message processor 1007 may be implemented on a processor running respective programs stored in a memory device (not shown).

LLRs of the received vector are fed as input to the FEC decoder 1002. The FEC decoder 1002 runs a decoding algorithm on the LLR vector to produce a decoded message. The decoder controller 1004 can perform a check at some predetermined decoded bits (indicated by the interleaver-1) to identify any possible decoding error. If the decoder controller 1004 finds that no decoding path of SCL decoder satisfies the CRC check at the intermediate decoding stage, it may terminate the decoding operation of FEC decoder 1002 immediately. If at least one decoding path in the list is found to pass a check, the FEC decoder 1002 is allowed to continue its decoding operation. After completion of decoding operation by FEC decoder 1002, the decoder controller 1004 may instruct the deinterleaver 1003 to perform a de-interleaving operation on the output of FEC decoder 1002 using at least one of the interleaver-1 stored in the interleaver-1 memory 1005 and the interleaver-2 stored in the interleaver-2 memory 1006. Following the de-intereleaving operation, a CRC test may be performed by the decoder controller 1004 to check if at least one of a list of candidate decoding paths satisfies the check. If at least one path satisfies the CRC check, then at least one such path may be sent to the decoded message processor 1007. It may be noted that certain variants of embodiment may not require a deinterleaver.

By introducing the interleaver-1 and the interleaver-2 into encoding and decoding processes, it is possible to detect a decoding error before completion of the SC/SCL decoding process while restricting a potential rise in undetected error rate.

8.3) Application to Mobile Communications System

The sender device 900 and the receiver device 1000 as described above may be integrated into a single communication device such as a user terminal (UE: User Equipment) or a base station (eNB, eNodeB, gNB, gNodeB etc.) in mobile communications systems.

Figure 17:
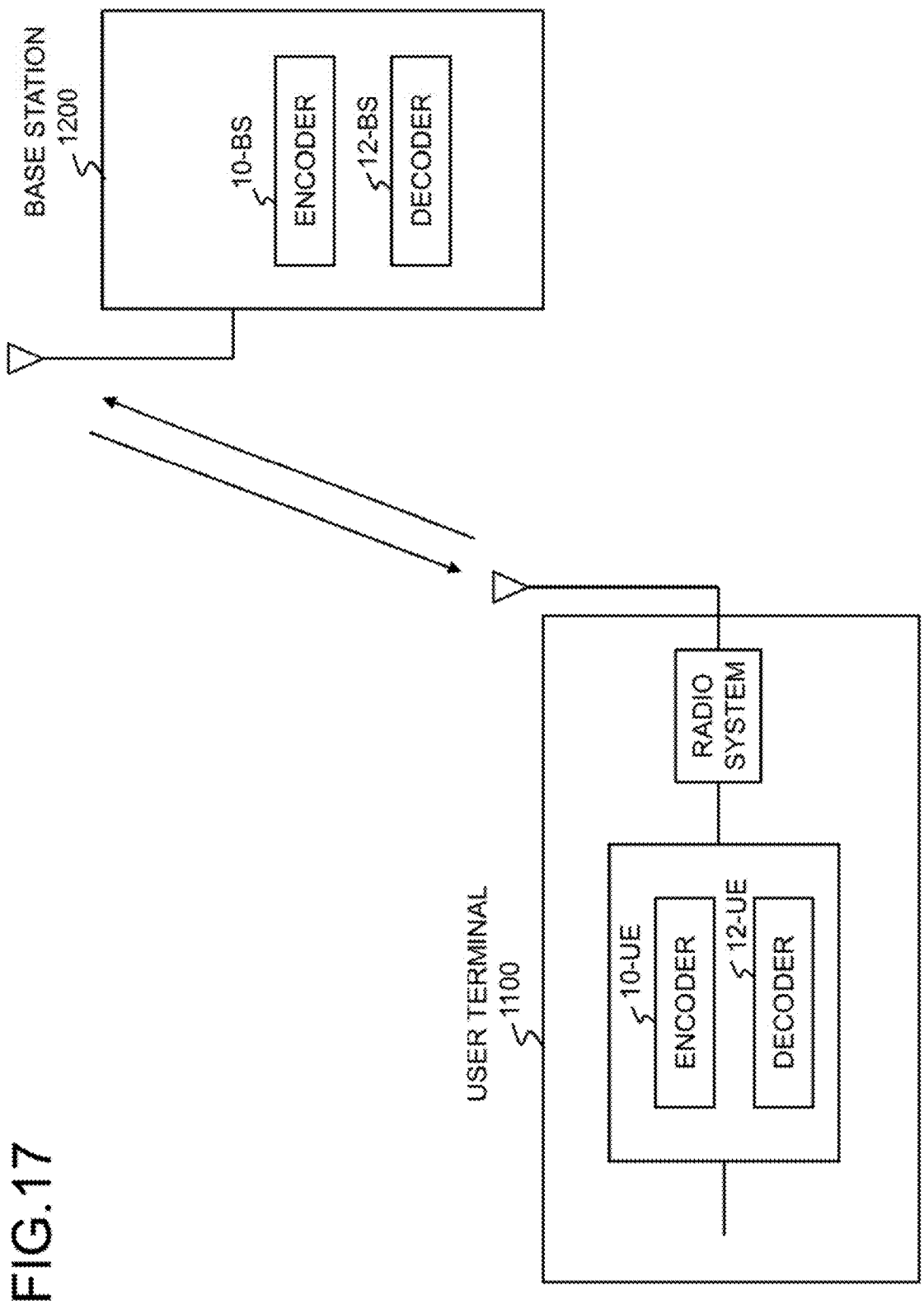
FIG. 17 is a diagram illustrating a radio communications system including a user terminal and a base station, each of which includes the sender device and the receiver device as shown in FIGS. 14 and 16.

As illustrated in FIG. 17, a user terminal 1100 is provided with an encoder 10-UE and a decoder 12-UE and a base station 1200 is provided with an encoder 10-BS and a decoder 12-BS. The encoders 10-UE and 10-BS each employ the encoder 10 as shown in FIG. 15 and the decoders 12-UE and 12-BS each employ the decoder 12 as shown in FIG. 16. Accordingly, the user terminal 1100 and the base station 1200 communicating with each other allow efficient and reliable decoding.

The above-described interleaver, which is the interleaver-1, the interleaver-2 or the combined interleaver of the interleaver-1 and the interleaver-2, may be applied to any one or all of UCI (Uplink Control Information), DCI (Downlink Control Information) and BCH (Broadcast Channel) as defined in 3GPP (e.g. Technical Specification 38.212 v 15.2.0 (2018-06)). Specifically, UCI is mapped to PUCCH (Physical Uplink Control Channel) or PUSCH (Physical Uplink Shared Channel). DCI is mapped to PDCCH (Physical Downlink Control Channel). BCH as Transport channel is mapped to PBCH (Physical Broadcast Channel).

It is needless to say that the above-described interleaver may be applied to transport channels as illustrated in FIG. 18 and control information as illustrated in FIG. 19 for transmission by physical channel.

In the communication system as illustrated in FIG. 17, the base station 1200 may notify the user terminal 1100 about which one of the interleaver-1, the interleaver-2 and the combined interleaver as described above should be used for communication. For instance, the base station 1200 may use System Information Block to broadcast an instruction to specify an interleaver to be used. Alternatively, the base station 1200 may use RRC (Radio Resource Control) or the like to notify the user terminal 1100 of the interleaver to be used. Such an instruction to specify the interleaver may be made for each transport channel or control information to which the specified interleaver is applied. The base station 1200 may notify the user terminal 1100 that the interleaver-specifying instruction is effective for a predetermined term. Further, the base station 1200 may notify the user terminal 1100 that the interleaver-specifying instruction is effective for one or more base station, one or more cell, on or more BandwidthPart, or any combination of them.

Moreover, the user terminal 1100 may notify the base station 1200 by UE capability message about which interleaver is supported: Interleaver-2 or both Interleaver-2 and a combined interleaver of the Interleaver-1 and Interleaver-2.

The base station 1200 may specify the interleaver to be used depending on its communication environment. The base station 1200 may specify the interleaver-2 or the combined interleaver of the Interleaver-1 and Interleaver-2 based on error rates for a predetermined term. Further, the base station 1200 may specify the interleaver-2 or the combined interleaver of the Interleaver-1 and Interleaver-2 based on the UE capability received from the user terminal 1100. Furthermore, the base station 1200 may specify an interleaver to be used based on application for communication or network slice thereof.

8.3) Other Examples

Where applicable, various embodiments provided by the present disclosure may be implemented using hardware, software, or combinations of hardware and software. Also where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the spirit of the present invention. In addition, where applicable, it is contemplated that software components may be implemented as hardware components, and vice-versa.

Although embodiments of the present disclosure have been described, these embodiments illustrate but do not limit the disclosure. For example, the frozen set may have any constant bit pattern (not restricting to the all-zero pattern) that is known to the decoder in advance. The generator matrix used in polar code encoding can be even of a form other than the n-time Kronecker product of $$G_2 = \begin{pmatrix} 1 & 0 \\ 1 & 1 \end{pmatrix}. \quad \text{(Math. 15)}$$

A different matrix may also be used as polarizing kernel. For example, the following matrix can be used as a different polarizing kernel:

$$G_2 = \begin{pmatrix} 1 & 0 & 0 \\ 1 & 1 & 0 \\ 1 & 0 & 1 \end{pmatrix}. \quad \text{(Math. 16)}$$

Check-bits may be of form other than parity-check or cyclic redundancy check bits. This disclosure does not limit the type of check function used to generate the check-bits. For instance, it can be any kind of parity check function using part or whole of the non-frozen set or frozen set. Reliability of indices may even be evaluated by metrics other than error probability or Z parameter. Bit-reversal permutation matrix B shown in Math. 4 may or may not be used for encoding.

An $I_{long}$ of length $K_{long}+C$ bits may be generated as discussed before (see 2. First exemplary embodiment). It is possible in some embodiments that $I_{long}$ is stored in memory and any interleaver $I_{short}$ corresponding to information length $K_{short}<K_{long}$ is obtained from the stored $I_{long}$. Here we describe a method by which a short interleaver may be obtained.

Method to Obtain a Short First Interleaver (Length $K_{short}+C$) from a Long First Interleaver (Length $K_{long}+C$)

Given: $I_{long}$.
Required: $I_{short}$.
Method:

$$I_{short}(j)=I_{long}(i_j)-(K_{long}-K_{short}) \quad \text{(Math. 17)}$$

where $i_0, i_1, \ldots, i_{K_{short}+C-1}$ is the integer sequence satisfying $$0 \le i_0 < i_1 < \ldots < i_{K_{short}+C-1} < K_{long}+C \text{ and } I_{long}(i_j) \ge K_{long}-K_{short} \text{ for } j=0,1,\ldots,K_{short}+C-1.$$

Method to Obtain a Short Second Interleaver (Length $I_{short}=K_{short}+C$) from a Long Second Interleaver (Length $K_{long}+C$)

Given: Let a long interleaver $I_{long}$ is known which may have been generated using a method described before (see 2.2 Interleaver-2 for Good error detection).

(Math. 18)

A non-frozen set $\Phi_{long}$ is known, $|\Phi_{long}|=K_{long}+C$.
Let $\phi_{long}=(\phi_0, \phi_1, \phi_2, \ldots, \phi_{K_{long}+C-1})$, $0 \le \phi_i < K_{long}+C$, such that $Z(\phi_0) \ge Z(\phi_1) \ge Z(\phi_2) \ge \ldots \ge Z(\phi_{K_{long}+C-1})$.
where $Z(\phi_i)$ denotes the error probability of index $\phi_i$.

(Math. 19)

Let $A_{long}=(a_0, a_1, a_2, \ldots a_{g_{long}+C-1})$. $0 \le a_i < K_{long}+C$ such that $wt(a_0) \ge wt(a_1) \ge \ldots \ge wt(a_{K_{long}+C-1})$ where $wt(j)=\Sigma_{i=0}^{C-1}h_{ij}$ and $H=[h_{ij}]$, $0 \le i < C$, $0 \le j < K_{long}+C$, is the $C \times (K_{long}+C)$ parity check matrix of the CRC code of length $K_{long}+C$ as described before.

Also, d is the number of CRC bits interleaved according to a first interleaver.

Required: To find $I_{short}$.
Method:
Obtain $A_{short}$ from $A_{long}$ as follows:

$$A_{short}(j)=A_{long}(i_j)-K_{long}-K_{short}) \quad \text{(Math. 20)}$$

where $i_0, i_1, \ldots, i_{K_{short}+C-1}$ the integer sequence satisfying $$0 \le i_0 < i_1 < \ldots < i_{K_{short}+C-1} < K_{long}+C \text{ and } A_{long}(i_j) \ge K_{long}-K_{short} \text{ for } j=0,1,\ldots,K_{short}+C-1.$$

Define $\phi_{short}(i)=\phi_{long}(K_{long}-K_{short}+i)-\text{count}(K_{long}-K_{short}+i)$, $0 \le i < K_{short}+C$ such that
$\text{count}(K_{long}-K_{short}+i)=|\{f:\phi_{long}(j)<\phi_{long}(K_{long}-K_{short}+i)\}|$, $0 \le i < K_{short}+C$, $0 \le j < K_{long}-K_{short}$. Here, $|\cdot|$ denotes cardinality of a set.

Let $I_2$ is an array of length $K_{short}+C$
$I_2(\phi_{short}(i))=A_{short}(i)$ for $0 \le i < K_{short}+C$.

Method to Obtain a Short Combined Interleaver (Length $K_{short}$ C) from a Long Combined Interleaver (Length $K_{long}+C$)

Given: Let a long interleaver $I_{long}$ is known which may have been generated using a method described before (see 3. Second exemplary embodiment).

(Math. 21)

A non-frozen set $\Phi_{long}$ is known: $|\Phi_{long}|=K_{long}+C$.

Let $\Phi_{long}=(\phi_0, \phi_1, \phi_2, \ldots, \phi_{g_{long}+C-1})$, $0 \le \phi_i < K_{long}+C$. such that $Z(\phi_0) \ge Z(\phi_1) \ge Z(\phi_2) \ge \ldots \ge Z(\phi_{K_{long}+C-1})$ where $Z(\phi_i)$ denotes the error probability of index $\phi_i$.

(Math. 22)

Let $A_{long}=(a_0, a_1, a_2, \ldots, a_{S_{long}+C-1})$, $0 \le a_i < K_{long}+C$ such that $wt(a_0) \ge wt(a_1) \ge \ldots \ge wt(a_{g_{long}+C-1})$ where $wt(j)=\Sigma_{i=0}^{c-1} h_{ij}$ and $H=[h_{ij}]$, $0 \le i < C$, $0 \le j < K_{long}+C$, is the $C \times (K_{long}+C)$ parity check matrix of the CRC code of length $K_{long}+C$ as described before.

Also, d is the number of CRC bits interleaved according to a first interleaver.

Required: To find $I_{short}$.

Step 1: Obtain $I_1$ (Math. 23)

Let $I_{long}(z_{long} - 1) = K_{long} + d - 1$.

$I^1_{long}$ be an array of length $K_{long} + C$ which is defined as follows:

$$I^1_{long}(i) = \begin{cases} I_{long}(i) & \text{if } 0 \le i < z_{long} \\ x(i - z_{long}) & \text{if } z_{long} \le i < N \end{cases}$$

where $x = \{t_{m, 0 \le m < N - z_{long}} \in I_{long}(z_{long} : N-1) \,|\,$ $t_m < t_{m+1} \,\forall\, 0 \le m < N - z_{long} - 1\}$ $I^1_{short}$ be an array of length $K_{short} + C$ which is defined as follows: $I^1_{short}(j) = I^1_{long}(i_j) - (K_{long} - K_{long})$ where $i_0, i_1, \ldots, i_{l_{short}-1}$ is the integer sequence satisfying $0 \le i_0 < i_1 < \ldots <$ $i_{K_{short}+C-1} < K_{long} + C$ and $I^1_{long}(i_j) \ge K_{long} - K_{short}$ for $j = 0$, $1, \ldots, K_{short} + C - 1$.

Let $I^1_{short}(z_{short} - 1) = K_{short} + d - 1$.

Let $I_1$ is an array of length $z_{short}$.

$I_1 = I^1_{short}(0 : z_{short} - 1)$.

Step 2: Obtain $I_2$ (Math. 24)

Obtain $A_{short}$ from $A_{long}$ as follows: $A_{short}(j) =$ $A_{long}(i_j) - (K_{long} - K_{short})$ where $i_0, i_1, \ldots, i_{K_{short}+C-1}$ is the integer sequence satisfying $0 \le i_0 < i_1 < \ldots <$ $i_{K_{short}+C-1} < K_{long} + C$ and $A_{long}(i_j) \ge K_{long} - K_{short}$ for $j =$ $0, 1, \ldots, K_{short} + C - 1$.

Define $\hat{A}$ as a sequence of length $K_{short} +$ $C - z_{short}$ as follows:

$\hat{A} = A_{short} \setminus I_1 = (\hat{a}_0, \hat{a}_1, \hat{a}_2, \ldots, \hat{a}_{K_{short}+C-z_{short}})$.

Define $\Phi_{short}(i) =$ $\Phi_{long}(K_{long} - K_{short} + i) - \text{count}(K_{long} - K_{short} + i)$, $0 \le i < K_{short} + C$ such that count $(K_{long} - K_{short} + i) =$ $|\{j : \Phi_{long}(j) < \Phi_{long}(K_{long} - K_{short} + i)\}|$, $0 \le i < K_{short} + C$, $0 \le j < K_{long} - K_{short}|$.

Then define $\hat{\Phi} = \Phi_{short} \setminus \{0, 1, 2, \ldots, z_{short} - 1\}$.

Let $I_2$ is an array of length $K_{short} + C - z_{short}$.

$I_2(\hat{\Phi}(i) - z_{short}) = \hat{a}_i$ for $0 \le i < K_{short} + C - z_{short}$.

Step 3: Obtain $I_{short}$

Obtain $I_{short}$ by concatenating $I_1$ and $I_2$. $I_{short} = I_1, I_2$

Note that, for obtaining a short interleaver-1 from a long interleaver-1, just the long interleaver-1 may be required. But for obtaining a short interleaver-2 from a long interleaver-2, a short non-frozen set (in descending order of error probability) and a shorter version of H matrix may be needed.

(Math. 25)

Let $H_{Long}=[h_{ij}]$, $0 \le i < C$, $0 \le j < K_{long}+C$, is a $C \times (K_{long}+C)$ parity check matrix of a CRC code of length $K_{long}+C$. Then a $C \times (K_{short}+C)$ matrix $H_{short}$ for any $K_{short} < K_{long}$ can be obtained by selecting the first $K_{short}+C$ columns of $SH_{long}$, where is a lower shift matrix defined as $S=[\delta_{i,j+1}]$, $\delta$ is a Kronecker delta, $0 \le i,j < K_{short}+C$.

Thus it is not needed to find $H_{short}$ from the polynomial division method for each value $K_{short}$, instead it may be simply obtained from the saved $H_{long}$. Moreover, it is also possible in some embodiments that none of $H_{long}$ and $H_{short}$ are computed. Instead, $H_{long}$ may be computed offline and only the column indices of $H_{long}$ can be stored in $A_{long}$, in descending order of column weights. A short set $A_{short}$ can be obtained from it in a straightforward manner as discussed before.

It is also possible that a short interleaver is obtained from a pre-stored long interleaver for a given CRC polynomial by using other methods which may or may not be simple variants of the method discussed here, however all such methods may be considered in the spirit of the present invention. For instance, an embodiment may obtain a short combined interleaver $I_{short}$ of length $K_{short}+C$ from a long combined interleaver $I_{long}$ of length $K_{long}+C$ as follows:

Given: $I_{long}$.

Required: $I_{short}$.

Method:

$$I_{short}(j)=I_{long}(i_j)-(K_{long}-K_{short}) \quad \text{(Math. 26)}$$

where $i_0, i_1, \ldots, i_{K_{short}+C-1}$ is the integer sequence satisfying $0 \le i_0 < i_1 < \ldots < i_{K_{short}+C-1} < K_{long}+C$ and $I_{long}(i_j) \ge K_{long} \ldots K_{short}$ for $j=0,1,\ldots,K_{short}+C-1$.

Application software in accordance with the present disclosure, such as computer programs executed by the device and may be stored on one or more computer readable mediums. It is also contemplated that the steps identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The User Equipment (or "UE", "mobile station", "mobile device" or "wireless device") in the present disclosure is an entity connected to a network via a wireless interface.

It should be noted that the present disclosure is not limited to a dedicated communication device, and can be applied to any device having a communication function as explained in the following paragraphs.

The terms "User Equipment" or "UE" (as the term is used by 3GPP), "mobile station", "mobile device", and "wireless device" are generally intended to be synonymous with one another, and include standalone mobile stations, such as terminals, cell phones, smart phones, tablets, cellular IoT devices, IoT devices, and machinery. It will be appreciated that the terms "mobile station" and "mobile device" also encompass devices that remain stationary for a long period of time.

A UE may, for example, be an item of equipment for production or manufacture and/or an item of energy related machinery (for example equipment or machinery such as: boilers; engines; turbines; solar panels; wind turbines; hydroelectric generators; thermal power generators; nuclear electricity generators; batteries; nuclear systems and/or associated equipment; heavy electrical machinery; pumps including vacuum pumps; compressors; fans; blowers; oil hydraulic equipment; pneumatic equipment; metal working machinery; manipulators; robots and/or their application systems; tools; molds or dies; rolls; conveying equipment; elevating equipment; materials handling equipment; textile machinery; sewing machines; printing and/or related machinery; paper converting machinery; chemical machinery; mining and/or construction machinery and/or related equipment; machinery and/or implements for agriculture, forestry and/or fisheries; safety and/or environment preservation equipment; tractors; precision bearings; chains; gears; power transmission equipment; lubricating equipment; valves; pipe fittings; and/or application systems for any of the previously mentioned equipment or machinery etc.).

A UE may, for example, be an item of transport equipment (for example transport equipment such as: rolling stocks; motor vehicles; motor cycles; bicycles; trains; buses; carts; rickshaws; ships and other watercraft; aircraft; rockets; satellites; drones; balloons etc.).

A UE may, for example, be an item of information and communication equipment (for example information and communication equipment such as: electronic computer and related equipment; communication and related equipment; electronic components etc.).

A UE may, for example, be a refrigerating machine, a refrigerating machine applied product, an item of trade and/or service industry equipment, a vending machine, an automatic service machine, an office machine or equipment, a consumer electronic and electronic appliance (for example a consumer electronic appliance such as: audio equipment; video equipment; a loud speaker; a radio; a television; a microwave oven; a rice cooker; a coffee machine; a dishwasher; a washing machine; a dryer; an electronic fan or related appliance; a cleaner etc.).

A UE may, for example, be an electrical application system or equipment (for example an electrical application system or equipment such as: an x-ray system; a particle accelerator; radio isotope equipment; sonic equipment; electromagnetic application equipment; electronic power application equipment etc.).

A UE may, for example, be an electronic lamp, a luminaire, a measuring instrument, an analyzer, a tester, or a surveying or sensing instrument (for example a surveying or sensing instrument such as: a smoke alarm; a human alarm sensor; a motion sensor; a wireless tag etc.), a watch or clock, a laboratory instrument, optical apparatus, medical equipment and/or system, a weapon, an item of cutlery, a hand tool, or the like.

A UE may, for example, be a wireless-equipped personal digital assistant or related equipment (such as a wireless card or module designed for attachment to or for insertion into another electronic device (for example a personal computer, electrical measuring machine)).

A UE may be a device or a part of a system that provides applications, services, and solutions described below, as to "internet of things (IoT)", using a variety of wired and/or wireless communication technologies.

Internet of Things devices (or "things") may be equipped with appropriate electronics, software, sensors, network connectivity, and/or the like, which enable these devices to collect and exchange data with each other and with other communication devices. IoT devices may comprise automated equipment that follow software instructions stored in an internal memory. IoT devices may operate without requiring human supervision or interaction. IoT devices might also remain stationary and/or inactive for a long period of time. IoT devices may be implemented as a part of a (generally) stationary apparatus. IoT devices may also be embedded in non-stationary apparatus (e.g. vehicles) or attached to animals or persons to be monitored/tracked.

It will be appreciated that IoT technology can be implemented on any communication devices that can connect to a communications network for sending/receiving data, regardless of whether such communication devices are controlled by human input or software instructions stored in memory.

It will be appreciated that IoT devices are sometimes also referred to as Machine-Type Communication (MTC) devices or Machine-to-Machine (M2M) communication devices. It will be appreciated that a UE may support one or more IoT or MTC applications. Some examples of MTC applications are listed in the following table (source: 3GPP TS 22.368 V13.1.0, Annex B, the contents of which are incorporated herein by reference). This list is not exhaustive and is intended to be indicative of some examples of machine—type communication applications.

TABLE 1

| Service Area | MTC applications |
| --- | --- |
| Security | Surveillance systems |
| | Backup for landline |
| | Control of physical access (e.g. to buildings) |
| | Car/driver security |
| Tracking & Tracing | Fleet Management |
| | Order Management |
| | Pay as you drive |
| | Asset Tracking |
| | Navigation |
| | Traffic information |
| | Road tolling |
| | Road traffic optimisation/steering |
| Payment | Point of sales |
| | Vending machines |
| | Gaming machines |
| Health | Monitoring vital signs |
| | Supporting the aged or handicapped |
| | Web Access Telemedicine points |
| | Remote diagnostics |
| Remote Maintenance/ Control | Sensors |
| | Lighting |
| | Pumps |
| | Valves |
| | Elevator control |
| | Vending machine control |
| | Vehicle diagnostics |
| Metering | Power |
| | Gas |
| | Water |
| | Heating |
| | Grid control |
| | Industrial metering |
| Consumer Devices | Digital photo frame |
| | Digital camera |
| | eBook |

Applications, services, and solutions may be an MVNO (Mobile Virtual Network Operator) service, an emergency radio communication system, a PBX (Private Branch eXchange) system, a PHS/Digital Cordless Telecommunications system, a POS (Point of sale) system, an advertise calling system, an MBMS (Multimedia Broadcast and Multicast Service), a V2X (Vehicle to Everything) system, a train radio system, a location related service, a Disaster/Emergency Wireless Communication Service, a community service, a video streaming service, a femto cell application service, a VoLTE (Voice over LTE) service, a charging service, a radio on demand service, a roaming service, an activity monitoring service, a telecom carrier/communication NW selection service, a functional restriction service, a PoC (Proof of Concept) service, a personal information management service, an ad-hoc network/DTN (Delay Tolerant Networking) service, etc.

Further, the above-described UE categories are merely examples of applications of the technical ideas and exemplary embodiments described in the present document. Needless to say, these technical ideas and embodiments are not limited to the above-described UE and various modifications can be made thereto.

It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

9. SUPPLEMENTARY NOTES

The whole or part of the exemplary embodiments disclosed above can be described as, but not limited to, the following supplementary notes.

(Supplementary Note 1)

A communication apparatus for forward error correction and detection using polar codes comprising a
  (a) polar encoder that encodes an input vector to output a polar codeword using a generator matrix of polar code wherein the input vector is a cyclic redundancy check (CRC) codeword of an information block;
  (b) a memory that stores a frozen set including frozen bit indices and a non-frozen set including non-frozen bit indices sorted in order of error probabilities;
  (c) and a controller that is configured to take as input the CRC codeword where CRC bits appended to the end of information block and interleave the CRC codeword using at least one of a first interleaver and second interleaver before feeding the CRC codeword to polar encoder such that:
    (i) the first interleaver places at least one CRC bit earlier than its original position in the CRC codeword and
    (ii) second interleaver selects at least one bit from the CRC codeword whose corresponding index in a parity check matrix of the CRC code has the highest column weight and puts it in the non-frozen bit index with highest decoding error probability.

(Supplementary Note 2)

A communication apparatus according to Supplementary note 1 wherein the first interleaver is obtained by column permutation of a parity-check matrix of CRC code.

(Supplementary Note 3)

A communication apparatus according to Supplementary notes 1 and 2 wherein if d CRC bits are intended to be interleaved by the first interleaver, then column permutation is performed on the first d rows of parity check matrix, where d is a predetermined integer greater than 0 and less or equal to the number of CRC bits.

(Supplementary Note 4)

A communication apparatus according to Supplementary notes 3 wherein the column corresponding to the last 1 in the first row is shifted to a preceding position than its original position.

(Supplementary Note 5)

A communication apparatus according to Supplementary note 3 wherein the column permutation in the first row of parity-check matrix is performed such that at least one column that has a value 1 in the first row is shifted to a preceding position than its original position.

(Supplementary Note 6)

A communication apparatus according to Supplementary notes 3 wherein the column permutation in a given row excepting the first row is done by selecting at least one column that has value 1 in the given row but value 0 in all preceding rows and shifting the selected column to a preceding position than its original position.

(Supplementary Note 7)

A communication apparatus according to Supplementary note 1, 2 and 3 wherein the first interleaver is an array of the column indices of parity check matrix after permutation of first d rows.

(Supplementary Note 8)

A communication apparatus according to Supplementary note 1 wherein the second interleaver is obtained by column permutation of a parity-check matrix of CRC code such that at least one column with highest column weight is shifted to the index corresponding to the highest decoding error probability in the non-frozen set.

(Supplementary Note 9)

A communication apparatus according to Supplementary note 8 wherein the second interleaver is an array of the column indices of parity check matrix after the permutation.

(Supplementary Note 10)

A communication apparatus according to Supplementary note 1 wherein a single interleaver is obtained by combining both first interleaver and second interleaver.

(Supplementary Note 11)

A communication apparatus according to Supplementary note 1 and 10 wherein the combined interleaver is obtained by concatenation of a first array and a second array such that:

column permutation corresponding to first interleaver is done on the first d rows of parity check matrix; the indices of the permuted columns are stored in the first array, column permutation corresponding to second interleaver is done on the columns of parity check matrix that were not permuted by the column permutation corresponding to first interleaver; the indices of the columns permuted by the second interleaver in stored in the second interleaver.

(Supplementary Note 12)

A communication apparatus according to supplementary note 1 wherein the CRC bits are appended to the end of information block in the CRC codeword before at least one of a first interleaver and second interleaver is used to interleave the CRC codeword.

(Supplementary Note 13)

The communication apparatus according to supplementary note 1, wherein at least one of Bhattacharyya parameter or bit error probability is used as a metric for decoding error probability.

(Supplementary Note 14)

The communication apparatus according to any one of supplementary notes 1-13, further comprising a decoder which performs decoding of a polar codeword received from another communication apparatus by using one of a Successive Cancellation decoding algorithm and a Successive Cancellation List decoding algorithm.

(Supplementary Note 15)

The method according to supplementary note 1, wherein c-(ii) comprises: comparing the decoding error probabilities of the plurality of indices in non-frozen set; and selecting the one index having a highest decoding error probability.

(Supplementary Note 16)

The method according to supplementary note 1, wherein c-(ii) comprises: comparing the column weights of a plurality of columns of parity check matrix of CRC code; and selecting the one index having a highest column weight.

(Supplementary Note 17)

A communication apparatus comprising:
a decoder that decodes a received codeword by using a decoding algorithm based on a successive cancellation method; and
a controller that is configured to check if a decoding path is correct, by using a check function employed at another communication apparatus,
  wherein the received codeword is generated by the another communication apparatus comprising a
  (a) polar encoder that encodes an input vector to output a polar codeword using a generator matrix of polar code wherein the input vector is a cyclic redundancy check (CRC) codeword of an information block;
  (b) a memory that stores a frozen set including frozen bit indices and a non-frozen set including non-frozen bit indices sorted in order of error probabilities;
  (c) and a controller that is configured to take as input the CRC codeword where CRC bits appended to the end of information block and interleave the CRC codeword using at least one of a first interleaver and second interleaver before feeding the CRC codeword to polar encoder such that:
    (i) the first interleaver places at least one CRC bit earlier than its original position in the CRC codeword and
    (ii) second interleaver selects at least one bit from the CRC codeword whose corresponding index in a parity check matrix of the CRC code has the highest column weight and puts it in the non-frozen bit index with highest decoding error probability.

(Supplementary Note 18)

The communication apparatus according to supplementary note 17, wherein the controller determines that a decoding path is correct if the decoding path satisfies a relation defined by the check function.

(Supplementary Note 19)

The communication apparatus according to supplementary notes 17 and 18, wherein the controller terminates a decoding path if the decoding path does not satisfy a relation defined by the check function.

(Supplementary Note 20)

The communication apparatus according to any one of supplementary notes 17-19, wherein the controller performs a check test on all active decoding paths at least at the CRC bits interleaved by using the first interleaver.

(Supplementary Note 21)

A communication system comprising:
a sender device that encodes a CRC codeword to a polar codeword using a generator matrix of polar code; and
a receiver device that receives the polar codeword from the sender device through a transmission channel,
wherein the sender device comprises:
a memory that stores a frozen set including frozen bit indices and a non-frozen set including non-frozen bit indices sorted in order of decoding error probabilities; and
a controller that is configured to take as input the CRC codeword where CRC bits appended to the end of information block and interleave the CRC codeword using at least one of a first interleaver and second interleaver before feeding the CRC codeword to polar encoder such that:
  (i) the first interleaver places at least one CRC bit earlier than its original position in the CRC codeword and
  (ii) second interleaver selects at least one bit from the CRC codeword whose corresponding index in a parity check matrix of the CRC code has the highest column weight and puts it in the non-frozen bit index with highest decoding error probability.

(Supplementary Note 22)

The communication system according to claim 19, wherein the receiver device comprises:
a decoder that decodes the codeword received from the sender device by using a decoding algorithm based on a successive cancellation method; and
a controller that is configured to check if a decoding path is correct, by using a check function employed at the sender device.

(Supplementary Note 23)

A computer-readable program stored in a non-transitory recoding medium in a communication device provided with an encoder that encodes an input vector to output a polar codeword using a generator matrix of polar code wherein the input vector is a cyclic redundancy check (CRC) codeword of an information block;
  (a) a memory that stores a frozen set including frozen bit indices and a non-frozen set including non-frozen bit indices sorted in order of error probabilities;
  (b) and a controller that is configured to take as input the CRC codeword where CRC bits appended to the end of information block and interleave the CRC codeword using at least one of a first interleaver and second interleaver before feeding the CRC codeword to polar encoder such that:
    (i) the first interleaver places at least one CRC bit earlier than its original position in the CRC codeword and
    (ii) second interleaver selects at least one bit from the CRC codeword whose corresponding index in a parity check matrix of the CRC code has the highest column weight and puts it in the non-frozen bit index with highest decoding error probability.

(Supplementary Note 24)

A non-transitory recording medium storing the computer-readable program according to supplementary note 23.

(Supplementary Note 25)

A sender device for forward error correction and detection using polar codes, comprising:
a cyclic redundancy check (CRC) encoder that appends CRC bits to an information block to output a CRC codeword;
an interleaver that interleaves the CRC codeword using at least one of a first interleaver and second interleaver to output an interleaved CRC codeword;
a polar encoder that encodes the interleaved CRC codeword using a generator matrix of polar code to output a polar codeword;
a memory that stores a frozen set including frozen bit indices and a non-frozen set including non-frozen bit indices sorted in order of error probabilities; and
a controller that controls the interleaver to select the first interleaver and the second interleaver, wherein
  the first interleaver places at least one CRC bit earlier than its original position in the CRC codeword; and the second interleaver selects at least one bit from the CRC codeword whose corresponding index in a parity check matrix of the CRC code has the highest column weight and puts it in the non-frozen bit index with highest decoding error probability.

(Supplementary Note 26)

An encoding method in a sender device for forward error correction and detection using polar codes, comprising:

by a cyclic redundancy check (CRC) encoder, appending CRC bits to an information block to output a CRC codeword;

by an interleaver, interleavings the CRC codeword using at least one of a first interleaver and second interleaver to output an interleaved CRC codeword;

by a polar encoder, encoding the interleaved CRC codeword using a generator matrix of polar code to output a polar codeword;

by a memory, storing a frozen set including frozen bit indices and a non-frozen set including non-frozen bit indices sorted in order of error probabilities;

and by a controller, controlling the interleaver to select the first interleaver and the second interleaver, wherein the first interleaver places at least one CRC bit earlier than its original position in the CRC codeword; and the second interleaver selects at least one bit from the CRC codeword whose corresponding index in a parity check matrix of the CRC code has the highest column weight and puts it in the non-frozen bit index with highest decoding error probability.

(Supplementary Note 27)

A receiver device for receiving a polar codeword from a sender device for forward error correction and detection using polar codes, comprising:

a forward error correction (FEC) decoder that decodes the polar codeword by using one of a Successive Cancellation decoding algorithm and a Successive Cancellation List decoding algorithm;

a deinterleaver that deinterleaves an output of the FEC decoder; and a controller that controls the FEC decoder and the deinterleaver using at least one of a first interleaver and a second interleaver, wherein at the sender device, a cyclic redundancy check (CRC) encoder appends CRC bits to an information block to output a CRC codeword;

an interleaver interleaves the CRC codeword using at least one of the first interleaver and the second interleaver to output an interleaved CRC codeword;

a polar encoder encodes the interleaved CRC codeword using a generator matrix of polar code to output the polar codeword; and a memory stores a frozen set including frozen bit indices and a non-frozen set including non-frozen bit indices sorted in order of error probabilities, wherein the first interleaver places at least one CRC bit earlier than its original position in the CRC codeword; and the second interleaver selects at least one bit from the CRC codeword whose corresponding index in a parity check matrix of the CRC code has the highest column weight and puts it in the non-frozen bit index with highest decoding error probability.

(Supplementary Note 28)

The receiver device according to claim 14, wherein the controller is configured to determine that a decoding path is correct if the decoding path satisfies a relation defined by a predetermined check function.

(Supplementary Note 29)

The receiver device according to claim 14 or 15, wherein the controller is configured to terminate a decoding path if the decoding path does not satisfy a relation defined by a predetermined check function.

(Supplementary Note 30)

The receiver device according to any one of claims 14-16, wherein the controller performs a check test on all active decoding paths at least at the CRC bits interleaved by using the first interleaver.

The above exemplary embodiments can be applied to communication systems employing polar encoding and decoding.

REFERENCE SIGNS LIST

10 Encoder
11 Channel
12 Decoder
101 CRC encoder
102, 102A, 102B Interleaver
103 Polar encoder
201 Message string
202 CRC codeword
203 interleaved CRC codeword
204 Polar codeword

What is claimed is:

1. A communication apparatus for forward error correction and detection using polar codes, comprising:

a polar encoder that encodes an input vector to output a polar codeword using a generator matrix of polar code, wherein the input vector is a cyclic redundancy check (CRC) codeword of an information block with CRC bits appended to the information block;

a memory that stores a frozen set including frozen bit indices and a non-frozen set including non-frozen bit indices sorted in order of error probabilities; and a controller that is configured to interleave the CRC codeword using at least one of a first interleaver and a second interleaver before feeding the interleaved CRC codeword to the polar encoder, wherein the first interleaver places at least one CRC bit earlier than an original position in the CRC codeword;

the second interleaver selects at least one bit from the CRC codeword having a corresponding column index of a plurality of column indices in a parity-check matrix of the CRC code that has a highest column weight and puts the at least one bit in the non-frozen bit index of the non-frozen set having a highest decoding error probability; and whether the controller is to use the first interleaver, the second interleaver, or both the first interleaver and the second interleaver so as to enable either or both of undetected error rate (UER) preservation via the second interleaver and early termination via the first interleaver.

2. A communication apparatus according to claim 1, wherein the first interleaver is obtained by column permutation of the parity-check matrix of the CRC code.

3. A communication apparatus according to claim 2, wherein in a case of the first interleaver interleaving d CRC bits, the column permutation is performed on first d rows of the parity-check matrix, where d is a predetermined integer greater than 0 and less or equal to a number of the CRC bits.

4. A communication apparatus according to claim 1, wherein the second interleaver is obtained by column permutation of the parity-check matrix of the CRC code such that at least one column with a highest column weight is shifted to a column index of the parity-check matrix corresponding to the highest decoding error probability in the non-frozen set.

5. A communication apparatus according to claim 4, wherein the second interleaver is an array of the column indices of the parity-check matrix after the permutation.

6. A communication apparatus according to claim 1, wherein the controller is configured to interleave the CRC codeword using both the first interleaver and the second interleaver by using a combined interleaver which is obtained by combining both the first interleaver and the second interleaver.

7. A communication apparatus according to claim 6, wherein the combined interleaver is obtained by concatenation of a first array and a second array such that:
   first column permutation corresponding to the first interleaver is done on first d rows of the parity-check matrix of the CRC code, wherein the column indices of columns of the parity-check matrix permuted by the first column permutation are stored in the first array; and
   second column permutation corresponding to the second interleaver is done on columns of the parity-check matrix that were not permuted by the first column permutation,
   wherein the column indices of columns of the parity-check matrix permuted by the second column permutation are stored in the second array.

8. The communication apparatus according to claim 1, further comprising:
   a decoder which performs decoding of the polar codeword received from another communication apparatus by using one of a Successive Cancellation decoding algorithm and a Successive Cancellation List decoding algorithm.

9. The communication apparatus according to claim 8, wherein the controller is further configured to determine that a decoding path is correct if the decoding path satisfies a relation defined by a predetermined check function.

10. The communication apparatus according to claim 8, wherein the controller is further configured to terminate a decoding path if the decoding path does not satisfy a relation defined by a predetermined check function.

11. The communication apparatus according to claim 8, wherein the controller performs a check test on all active decoding paths at least at the CRC bits interleaved by using the first interleaver.

12. A sender device for forward error correction and detection using polar codes, comprising:
   a cyclic redundancy check (CRC) encoder that appends CRC bits to an information block to output a CRC codeword;
   an interleaver that interleaves the CRC codeword using at least one of a first interleaver and a second interleaver to output an interleaved CRC codeword;
   a polar encoder that encodes the interleaved CRC codeword using a generator matrix of polar code to output a polar codeword;
   a memory that stores a frozen set including frozen bit indices and a non-frozen set including non-frozen bit indices sorted in order of error probabilities; and
   a controller that controls the interleaver to select the first interleaver and the second interleaver, wherein
   the first interleaver places at least one CRC bit earlier than an original position in the CRC codeword;
   the second interleaver selects at least one bit from the CRC codeword having a corresponding column index of a plurality of column indices in a parity check matrix of the CRC code that has a highest column weight and puts the at least one bit in the non-frozen bit index of the non-frozen set having a highest decoding error probability; and
   whether the controller is to use the first interleaver, the second interleaver, or both the first interleaver and the second interleaver so as to enable either or both of undetected error rate (UER) preservation via the second interleaver and early termination via the first interleaver.

13. A receiver device for receiving a polar codeword from a sender device for forward error correction and detection using polar codes, comprising:
   a forward error correction (FEC) decoder that decodes the polar codeword by using one of a Successive Cancellation decoding algorithm and a Successive Cancellation List decoding algorithm;
   a deinterleaver that deinterleaves an output of the FEC decoder; and
   a controller that controls the FEC decoder and the deinterleaver using at least one of a first interleaver and a second interleaver,
   wherein at the sender device,
   a cyclic redundancy check (CRC) encoder appends CRC bits to an information block to output a CRC codeword;
   an interleaver interleaves the CRC codeword using at least one of the first interleaver and the second interleaver to output an interleaved CRC codeword;
   a polar encoder encodes the interleaved CRC codeword using a generator matrix of polar code to output the polar codeword; and
   a memory stores a frozen set including frozen bit indices and a non-frozen set including non-frozen bit indices sorted in order of error probabilities,
   wherein
   the first interleaver places at least one CRC bit earlier than an original position in the CRC codeword;
   the second interleaver selects at least one bit from the CRC codeword having a corresponding column index of a plurality of column indices in a parity-check matrix of the CRC code that has a highest column weight and puts the at least one bit in the non-frozen bit index of the non-frozen set having a with highest decoding error probability; and
   whether the controller is to use the first interleaver, the second interleaver, or both the first interleaver and the second interleaver so as to enable either or both of undetected error rate (UER) preservation via the second interleaver and early termination via the first interleaver.

14. The receiver device according to claim 13, wherein the controller is configured to determine that a decoding path is correct if the decoding path satisfies a relation defined by a predetermined check function.

15. The receiver device according to claim 13, wherein the controller is configured to terminate a decoding path if the decoding path does not satisfy a relation defined by a predetermined check function.

16. The receiver device according to claim 13, wherein the controller performs a check test on all active decoding paths at least at the CRC bits interleaved by using the first interleaver.

* * * * *